(12) United States Patent
Min et al.

(10) Patent No.: US 11,069,829 B2
(45) Date of Patent: Jul. 20, 2021

(54) LIGHT-EMITTING ELEMENT, METHOD OF MANUFACTURING THE SAME AND DISPLAY DEVICE COMPRISING LIGHT-EMITTING ELEMENT

(71) Applicant: Samsung Display Co. Ltd., Yongin-si (KR)

(72) Inventors: Jung Hong Min, Pyeongtaek-si (KR); Dae Hyun Kim, Hwaseong-si (KR); Hyun Min Cho, Seoul (KR); Jong Hyuk Kang, Suwon-si (KR); Dong Uk Kim, Hwaseong-si (KR); Seung A Lee, Seoul (KR); Hyun Deok Im, Seoul (KR); Hyung Rae Cha, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 35 days.

(21) Appl. No.: 16/435,313

(22) Filed: Jun. 7, 2019

(65) Prior Publication Data

US 2019/0378954 A1 Dec. 12, 2019

(30) Foreign Application Priority Data

Jun. 11, 2018 (KR) .................. 10-2018-0066729

(51) Int. Cl.
 *H01L 33/00* (2010.01)
 *H01L 33/30* (2010.01)
(52) U.S. Cl.
 CPC ...... *H01L 33/0093* (2020.05); *H01L 33/0066* (2013.01); *H01L 33/30* (2013.01)
(58) Field of Classification Search
 CPC .. H01L 33/0093; H01L 33/30; H01L 33/0066
 See application file for complete search history.

(56) References Cited

U.S. PATENT DOCUMENTS

| | | | |
|---|---|---|---|
| 8,148,238 B2 | 4/2012 | Taniguchi et al. | |
| 2010/0197054 A1* | 8/2010 | Yonehara | H01L 27/15 438/23 |
| 2015/0255668 A1 | 9/2015 | Pan et al. | |
| 2018/0130883 A1* | 5/2018 | Hardy | H01L 21/02502 |

* cited by examiner

*Primary Examiner* — Quoc D Hoang
(74) *Attorney, Agent, or Firm* — Lewis Roca Rothgerber Christie LLP

(57) ABSTRACT

Provided is a method of manufacturing a light-emitting element, the method including positioning a substrate, forming a first separation layer, which includes a first sacrificial layer, an etching control layer on the first sacrificial layer, and a second sacrificial layer on the etching control layer, on the substrate, forming at least one first light-emitting element on the first separation layer, and separating the first light-emitting element from the substrate.

14 Claims, 18 Drawing Sheets

LIGHT-EMITTING ELEMENT, METHOD OF MANUFACTURING THE SAME AND DISPLAY DEVICE COMPRISING LIGHT-EMITTING ELEMENT

CROSS-REFERENCE TO RELATED APPLICATION

This application claims priority to, and the benefit of, Korean Patent Application No. 10-2018-0066729, filed on Jun. 11, 2018 in the Korean Intellectual Property Office, the disclosure of which is incorporated herein by reference in its entirety.

BACKGROUND

1. Field

Embodiments of the present invention relate to a light-emitting element, such as an ultra-small light-emitting element including a quantum well structure, to a method of manufacturing the light-emitting element, and to a display device including the light-emitting element.

2. Description of the Related Art

A light-emitting diode (hereinafter referred to as an LED) exhibits relatively good durability even under adverse environmental conditions, and has excellent performance in terms of lifetime and luminance. In recent years, studies for applying such an LED to various light-emitting devices have been actively conducted. As a part of the studies, a technique for manufacturing ultra-small rod-shaped LEDs (e.g., microscale or nanoscale) using a structure in which an inorganic crystal structure (e.g., a nitride-based semiconductor) is grown, has been developed.

For example, the LED may be manufactured to have a small enough size to constitute pixels or the like of a self-emission display panel. After the LED is independently grown separately from the substrate, the grown LED may be separated and then used for the manufacturing of the display panel and the like. When physically separating the grown LED, one end of the LED has an irregular shape, and the substrate on which the LED is grown cannot be reused.

SUMMARY

An aspect of embodiments of the present invention provides a method for manufacturing a light-emitting element capable of reusing a substrate on which the light-emitting element is grown. Another aspect of embodiments of the present invention provides a light-emitting element of which a separation surface is flat and not irregular. Still another aspect of embodiments of the present invention provides a display device including a light-emitting element having a flat separation surface.

However, the embodiments are not restricted to the one set forth herein. The above and other aspects of embodiments of the present invention will become more apparent to one of ordinary skill in the art to which the present invention pertains by referencing the detailed description of embodiments of the present invention given below.

Details of other embodiments will be included in the detailed description, and in the accompanying drawings.

According to an aspect of the present disclosure, there is provided a method of manufacturing a light-emitting element, the method including positioning a substrate, forming a first separation layer, which includes a first sacrificial layer, an etching control layer on the first sacrificial layer, and a second sacrificial layer on the etching control layer, on the substrate, forming at least one first light-emitting element on the first separation layer, and separating the first light-emitting element from the substrate.

The forming of the first light-emitting element may include forming a first light-emitting laminate including a first semiconductor layer, an active layer on the first semiconductor layer, and a second semiconductor layer on the active layer.

The forming of the first light-emitting element may further include performing a first etching process after forming the first light-emitting laminate, the first etching process including forming a mask layer on the first light-emitting laminate, forming a fine pattern on the mask layer, and vertically etching the first light-emitting laminate along the fine pattern.

The forming of the first light-emitting element may further include performing a second etching process after the first etching process, the second etching process including forming an insulating film on the vertically etched first light-emitting laminate and vertically etching a part of the insulating film.

The active layer may be configured to emit light having a wavelength of about 500 nm to about 900 nm.

The active layer may include at least one of GaInP, AlGaInP, GaAs, AlGaAs, InP, and InAs.

The etching control layer may be thicker than the first sacrificial layer and the second sacrificial layer.

The etching control layer may be formed with a thickness of about 50 nm to about 150 nm, and wherein the first sacrificial layer and the second sacrificial layer are formed with a thickness of about 10 nm to about 50 nm.

The etching control layer may include GaInP, and the first sacrificial layer and the second sacrificial layer may include AlAs or AlGaAs.

The separating of the first light-emitting element from the substrate may include a first chemical separation process of separating the first light-emitting element by removing the second sacrificial layer, and a second chemical separation process of separating the etching control layer by removing the first sacrificial layer.

After the first chemical separation process, a lower surface of the first light-emitting element may be substantially flat to be parallel to an upper surface of the first light-emitting element.

After the second chemical separation process, an upper surface of the substrate may be substantially smooth to be parallel to a lower surface of the substrate.

The first chemical separation process may be performed before the second chemical separation process.

The method may further include forming a second light-emitting element on the substrate after separating the first light-emitting element from the substrate.

The method may further include forming a second separation layer on the substrate between the separating of the light-emitting element from the substrate and the forming of the second light-emitting element on the substrate.

According to another aspect of the present disclosure, there is provided a light-emitting element including a first semiconductor layer, an active layer on the first semiconductor layer, a second semiconductor layer on the active layer, and an insulating film surrounding side surfaces of the first semiconductor layer, the active layer, and the second semiconductor layer, wherein the active layer includes at least one of GaInP, AlGaInP, GaAs, AlGaAs, InP, or InAs, and wherein a lower end of the insulating film protrudes to extend beyond a lower surface of the first semiconductor layer.

The side surfaces of the first semiconductor layer, the active layer, and the second semiconductor layer may be aligned with each other to form a light-emitting laminate.

The lower surface of the first semiconductor layer may be parallel to an upper surface of the second semiconductor layer.

An upper end of the insulating film may be aligned with the upper surface of the second semiconductor layer.

According to another aspect of the present disclosure, there is provided a display device including a base substrate, a first electrode and a second electrode spaced apart from each other on the base substrate, a first contact electrode on an upper surface of the first electrode, a second contact electrode on an upper surface of the second electrode, and at least one light-emitting element between the first electrode and the second electrode, wherein respective side surfaces of the light-emitting element contact the first contact electrode and the second contact electrode, contact the first contact electrode and the second contact electrode, and have a flat shape to be substantially perpendicular to the base substrate, wherein the light-emitting element includes a first semiconductor layer, an active layer on the first semiconductor layer, a second semiconductor layer on the active layer, and an insulating film surrounding side surfaces of the first semiconductor layer, the active layer, and the second semiconductor layer, wherein the active layer includes at least one of GaInP, AlGaInP, GaAs, AlGaAs, InP, or InAs, and wherein a lower end of the insulating film protrudes downward from a lower surface of the first semiconductor layer.

BRIEF DESCRIPTION OF THE DRAWINGS

The above and other aspects of embodiments of the present invention will become more apparent by describing in detail exemplary embodiments thereof with reference to the attached drawings, in which.

DETAILED DESCRIPTION

Figure 1:
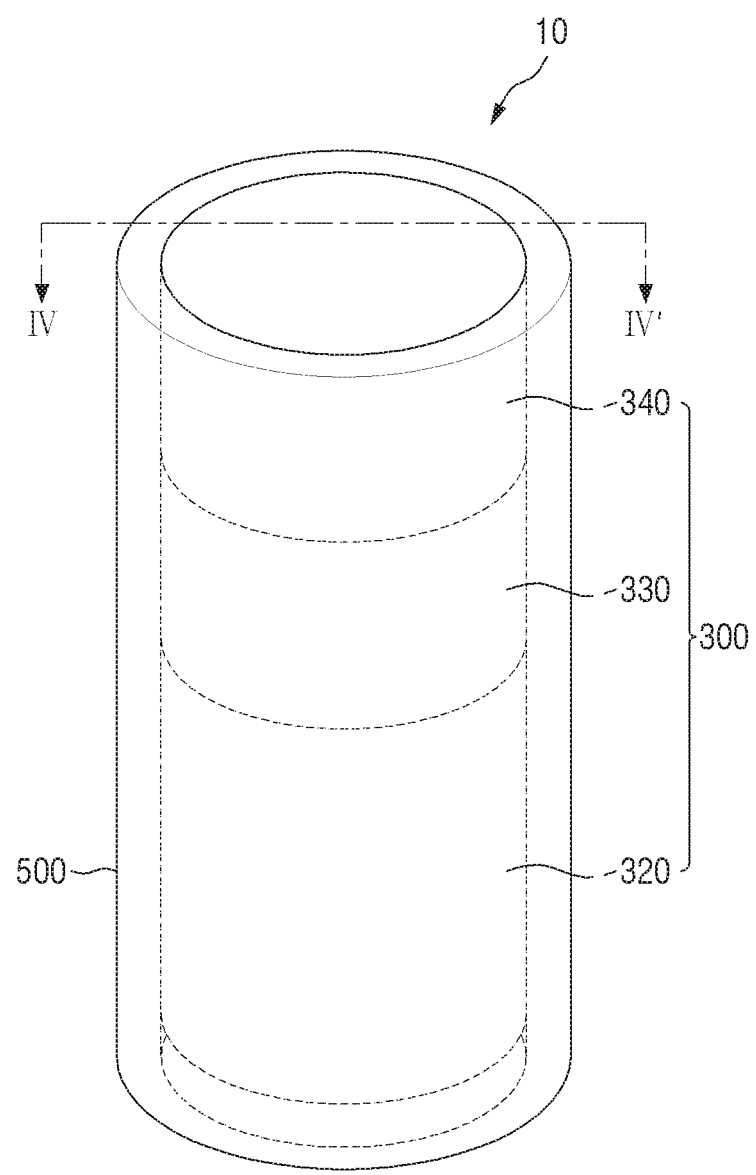
FIGS. 1 to 3 are perspective views showing a light-emitting element according to embodiments.

Features of the inventive concept and methods of accomplishing the same may be understood more readily by reference to the following detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of the present inventive concept to those skilled in the art. Accordingly, processes, elements, and techniques that are not necessary to those having ordinary skill in the art for a complete understanding of the aspects and features of the present inventive concept may not be described. Unless otherwise noted, like reference numerals denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present invention.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
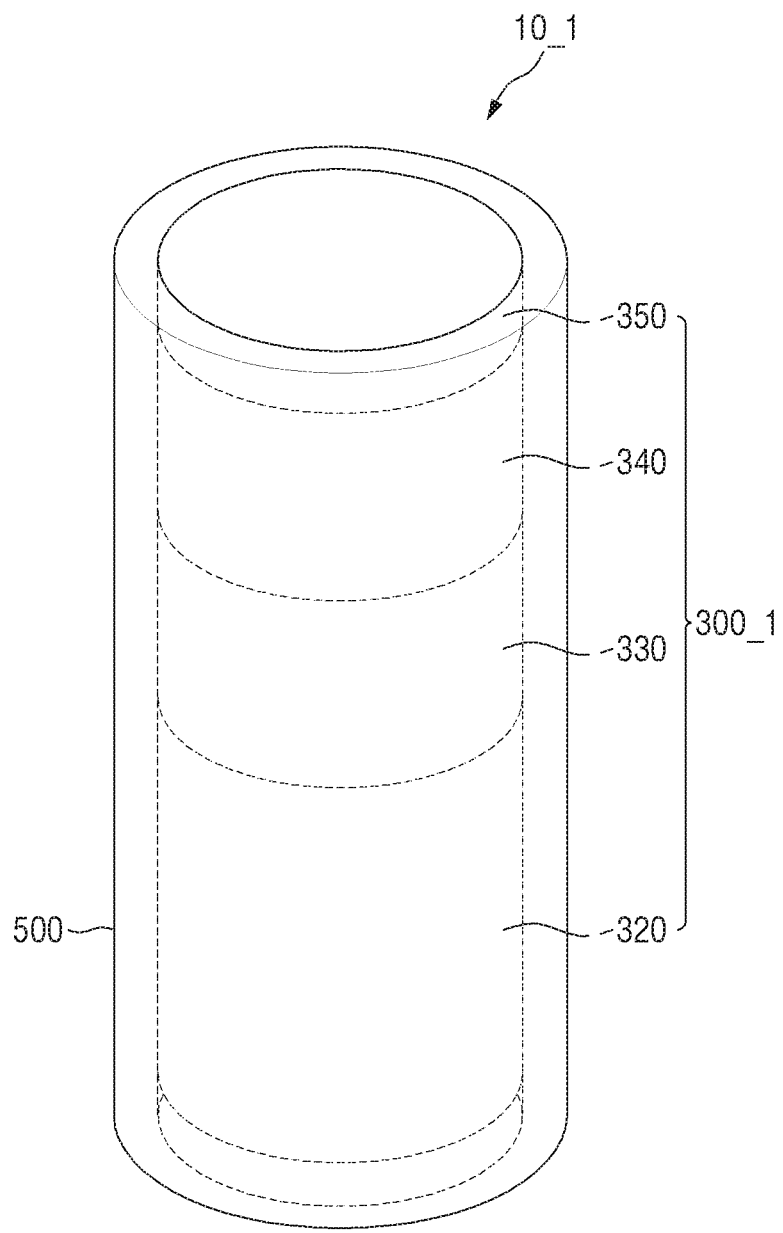
Figure 3:
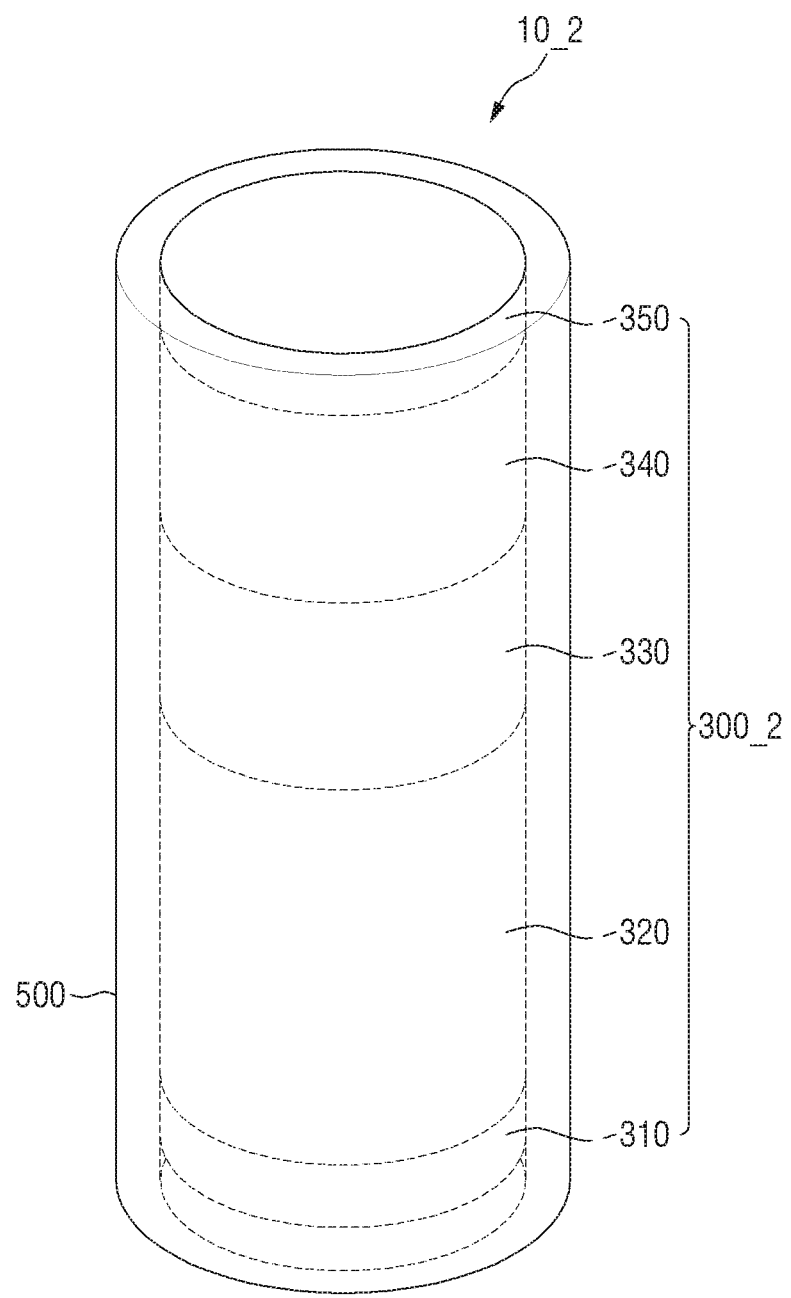
Figure 4:
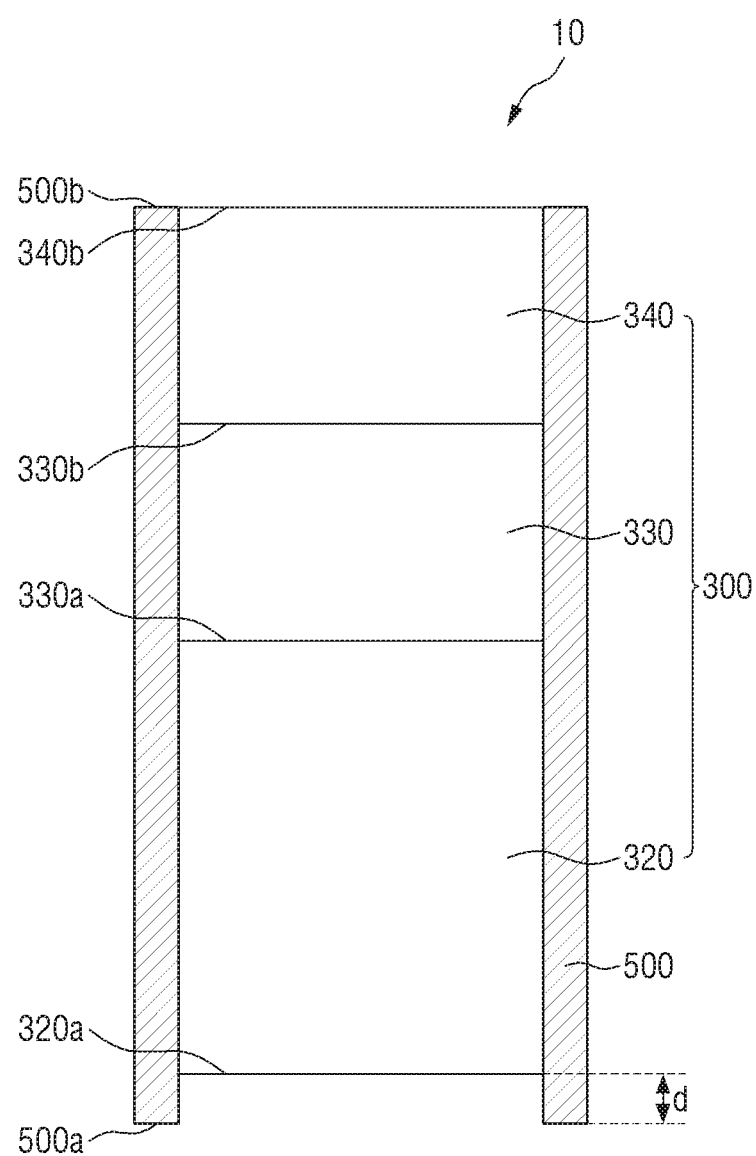
FIG. 4 is a cross-sectional view of a light-emitting element according to an embodiment.

FIGS. 1 to 3 are perspective views showing a light-emitting element according to embodiments. FIG. 4 is a cross-sectional view of a light-emitting element according to an embodiment.

FIGS. 1 to 3 show a light-emitting element 10 having a cylindrical shape, but the shape of the light-emitting element 10 may be variously modified. For example, the light-emitting element 10 may have various polyprism shapes including a rectangular parallelepiped shape. Such a light-emitting element 10 may have a rod-like shape, a bar-like shape, or a wire-like shape that is long in a longitudinal direction (that is, an aspect ratio may be larger than 1).

Referring to FIGS. 1 to 3, the light-emitting element 10 may include a first semiconductor layer 320, an active layer 330, and a second semiconductor layer 340. The light-emitting element 10 may include a stacked structure in which the first semiconductor layer 320, the active layer 330, and the second semiconductor layer 340 are stacked in this order. The active layer 330 may be interposed between the first semiconductor layer 320 and the second semiconductor layer 340. Hereinafter, the laminated structure including the first semiconductor layer 320, the active layer 330, and the second semiconductor layer 340 may be collectively referred to as a light-emitting laminate 300. The light-emitting laminate 300 includes the first semiconductor layer 320, the active layer 330 and the second semiconductor layer 340, and may further include a first electrode layer 310 (e.g., light-emitting laminate 300_2 in FIG. 3) and/or a second electrode layer 350 (e.g., light-emitting laminates 300_1 and 300_2 in FIGS. 2 and 3, respectively).

Referring to FIG. 3, the light-emitting element 10_2 includes the first electrode layer 310 electrically connected to the first semiconductor layer 320 and the second electrode layer 350 electrically connected to the second semiconductor layer 340.

In another embodiment, the light-emitting element 10 may omit any one of the first electrode layer 310 and the second electrode layer 350. For example, FIG. 2 shows that a light-emitting element 10_1 does not include the first electrode layer (e.g., first electrode layer 310 in FIG. 3) and includes the second electrode layer 350.

In yet another embodiment, the light-emitting element 10 may omit both the first electrode layer 310 and the second electrode layer 350. FIG. 1 shows that a light-emitting element 10 does not include the first electrode layer (e.g., first electrode layer 310 in FIG. 3) and the second electrode layer (e.g., second electrode layer 350 in FIG. 3). Hereinafter, the light-emitting laminate 300 is configured by the first semiconductor layer 320, the active layer 330, and the second semiconductor layer 340, but may further include the first electrode layer 310 and/or the second electrode layer 350.

The light-emitting element 10 may include an insulating film 500 covering the light-emitting laminate 300 described above. The insulating film 500 may reduce the likelihood of, or prevent, an electrical short circuit that may occur when the active layer 330 contacts a conductive material other than the first semiconductor layer 320 and the second semiconductor layer 340. The insulating film 500 protects an outer surface including the active layer 330 of the light-emitting element 10, thereby preventing a decrease in light emission efficiency. In addition, when a plurality of light-emitting elements 10 is closely located, the insulating film 500 may reduce the likelihood of, or prevent, an undesired short circuit that may otherwise occur between the light-emitting elements 10. The presence of the insulating film 500 is not limited as long as the active layer 330 is less likely to short-circuit with the external conductive material.

The insulating film 500 may completely cover a side surface of the active layer 330, and may cover at least a part of the side surfaces of the first semiconductor layer 320 and the second semiconductor layer 340. When the light-emitting element 10 includes the first electrode layer 310 and/or the second electrode layer 350, the insulating film 500 may include at least a part of the first electrode layer 310 and/or the second electrode layer 350. In this case, the insulating film 500 may completely cover the side surfaces of the first semiconductor layer 320 and the second semiconductor layer 340. According to the present embodiment, the insulating film 500 may not completely cover, but may instead partially cover, only the side surfaces of the first electrode layer 310 and/or the second electrode layer 350. If the side surfaces of the first electrode layer 310 and the second electrode layer 350 are not completely covered, an exposed area is increased, and the insulating film 500 may be effectively electrically connected to a conductive material. For convenience of description, it is described that the insulating film 500 covers the entire side surface of the light-emitting element 10, although other embodiments can be equally applied to a case where the insulating film 500 exposes a part of an outermost layer at both ends of the light-emitting element 10.

FIG. 4 is a cross-sectional view of a light-emitting element 10 according to an embodiment. Although the first electrode layer 310 and the second electrode layer 350 are not shown in FIG. 4, for convenience for description, the light-emitting element 10 may include the first electrode layer 310 that is located at a lower portion of the first semiconductor layer 320, and that is electrically connected to the first semiconductor layer 320, and may also include the second electrode layer 350 that is located on an upper portion of the second semiconductor layer 340, and that is electrically connected to the second semiconductor layer 340. When the light-emitting element 10 includes the first electrode layer 310 or the second electrode layer 350, the ends of the light-emitting element 10 may be, respectively, a lower surface 310a of the first electrode layer 310 and an upper surface 350b of the second electrode layer 350.

Referring to FIG. 4, the light-emitting element 10 may include an upper surface 340b (e.g. see FIG. 18) of the second semiconductor layer 340, and a lower surface 320a of the first semiconductor layer 320, which are at both ends of the light-emitting element 10 and are exposed to the outside. The insulating film 500 might not cover the upper surface 340b of the second semiconductor layer 340 and the lower surface 320a of the first semiconductor layer 320. At least a part of the upper surface 340b of the second semiconductor layer 340 and the lower surface 320a of the first semiconductor layer 320 may be exposed. The upper surface 340b of the second semiconductor layer 340 and the lower surface 320a of the first semiconductor layer 320 may be surfaces that are in contact with an external conductive material and that are electrically connected to the conductive material.

An upper surface 500b of the insulating film 500 may be located on the same plane as the upper surface 340b of the second semiconductor layer 340. However, the present invention is not limited thereto, and the upper surface 500b of the insulating film 500 may be located closer to the substrate 100 (e.g., the substrate 100 shown in FIG. 18) than the upper surface 340b of the second semiconductor layer 340. The upper surface 500b of the insulating film 500 is defined as a virtual surface including an upper periphery of the insulating film 500. A lower surface 500a of the insulating film 500 may be located closer to the substrate 100 than the lower surface 320a of the first semiconductor layer 320. The lower surface 500a of the insulating film 500 is defined as a virtual surface including a lower periphery of the insulating film 500. A height difference between the lower surface 500a of the insulating film 500 and the lower surface 320a of the first semiconductor layer 320 may be within about 100 nm. However, the present invention is not limited thereto, and the lower surface 500a of the insulating film 500 may be located even more closely to the substrate 100 than the lower surface 320a of the first semiconductor layer 320. Further, the lower surface 500a of the insulating film 500 may be located farther from the lower surface 330a of the active layer 330 than the lower surface 320a of the first semiconductor layer 320. As an example, a length of the insulating film 500 may be larger than a length of the light-emitting element 10 including the first semiconductor layer 320, the active layer 330 and the second semiconductor layer 340, based on the longitudinal direction of the light-emitting element 10.

The light-emitting element 10 described above may be used as a light-emitting source of various light-emitting devices. As an example, the light-emitting element 10 may be used as a light source of a lighting device or a self-emission display panel.

Figure 5:
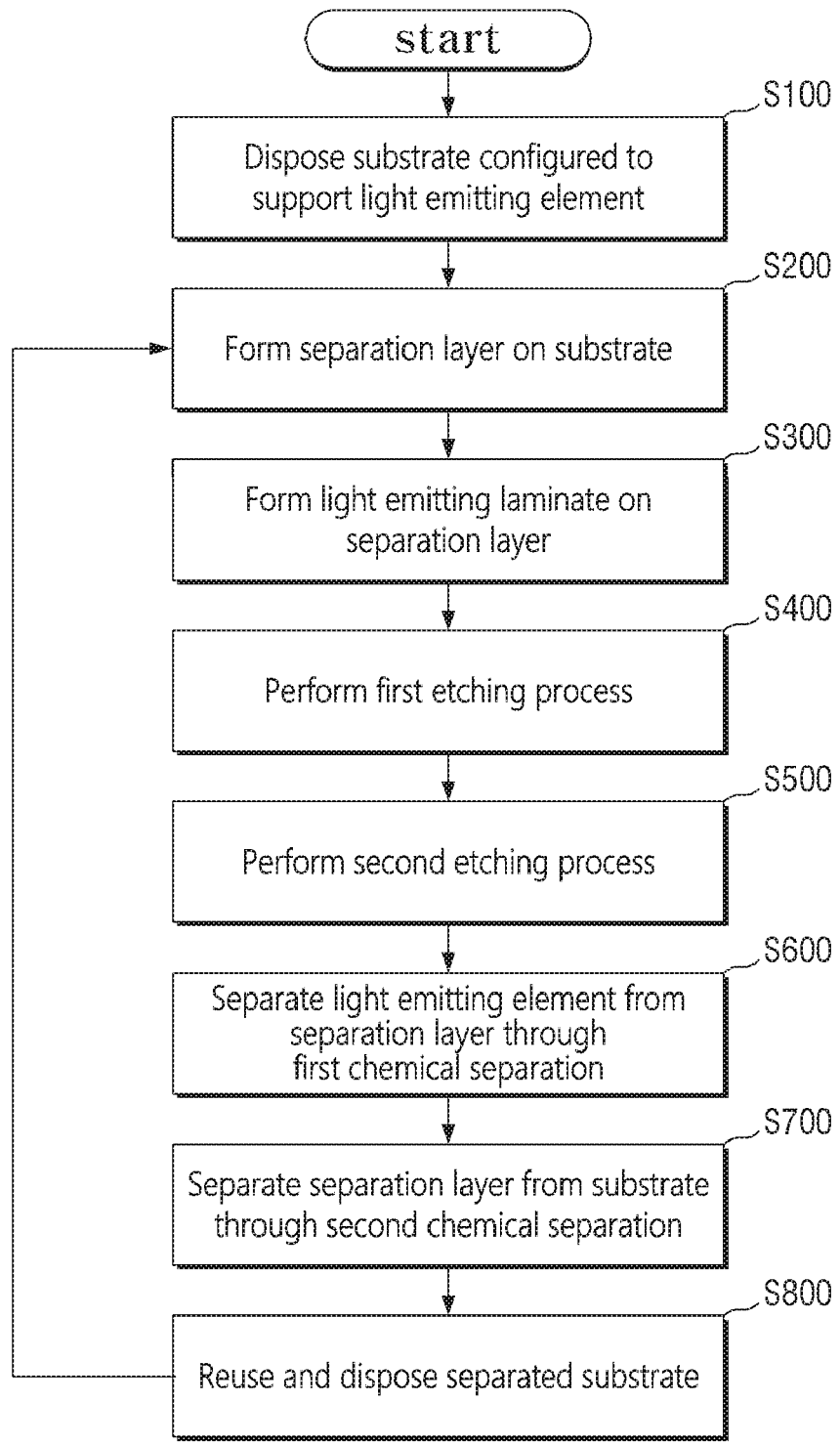
FIG. 5 is a flowchart illustrating a method of manufacturing a light-emitting element according to an embodiment.
Figure 6:
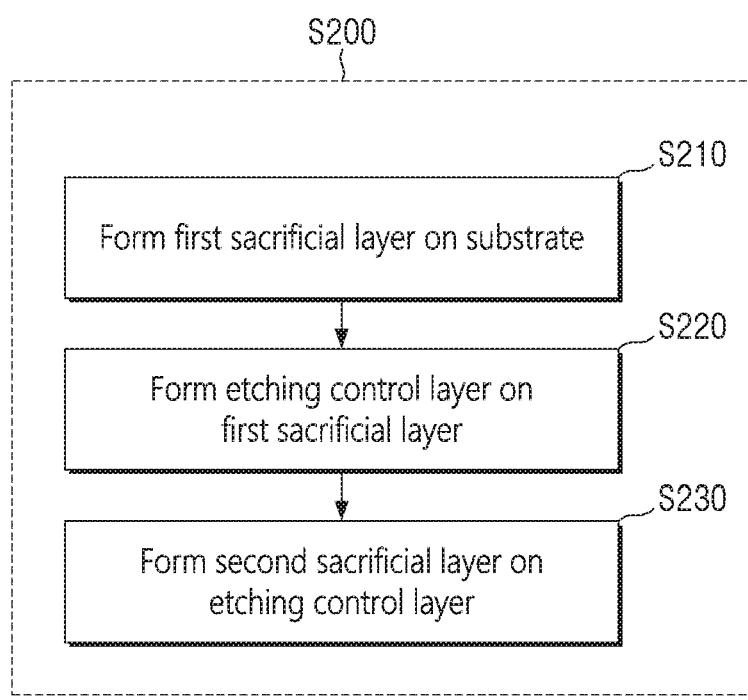
FIG. 6 is a detailed flowchart of an operation of forming a separation layer according to an embodiment.
Figure 7:
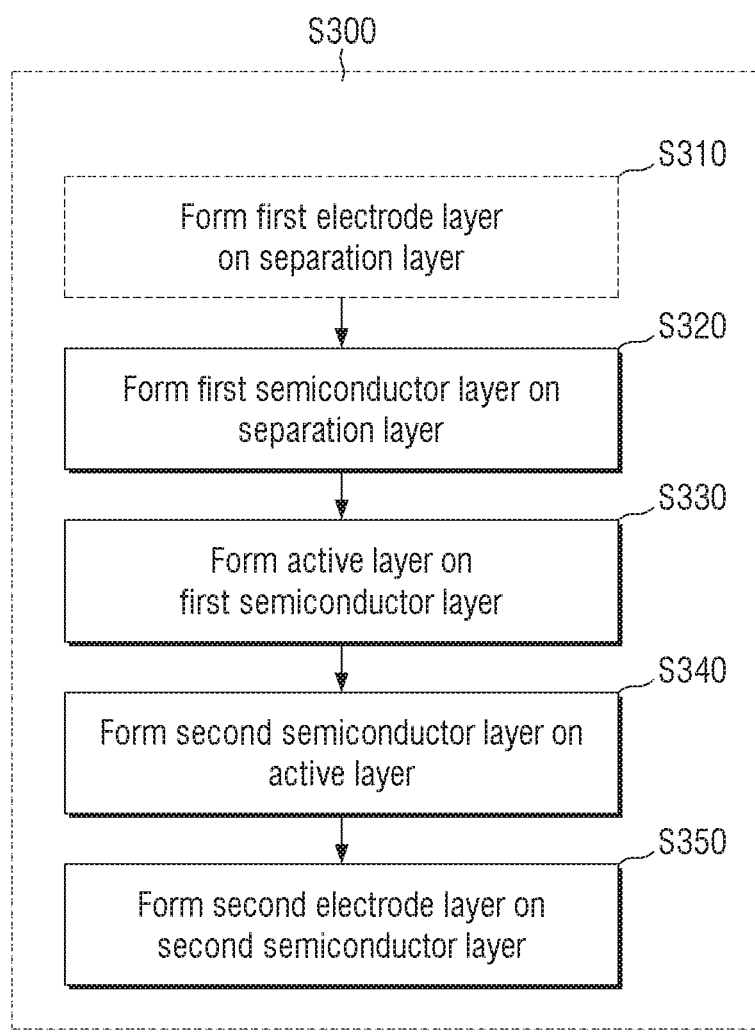
FIG. 7 is a detailed flowchart of an operation of forming a light-emitting laminate according to an embodiment.
Figure 8:
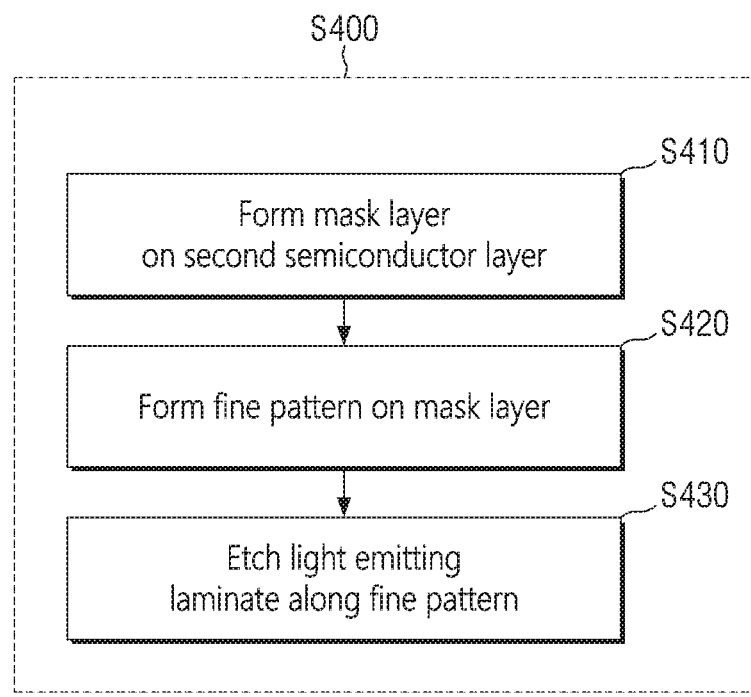
FIG. 8 is a detailed flowchart of an operation of performing a first etching process according to an embodiment.
Figure 9:
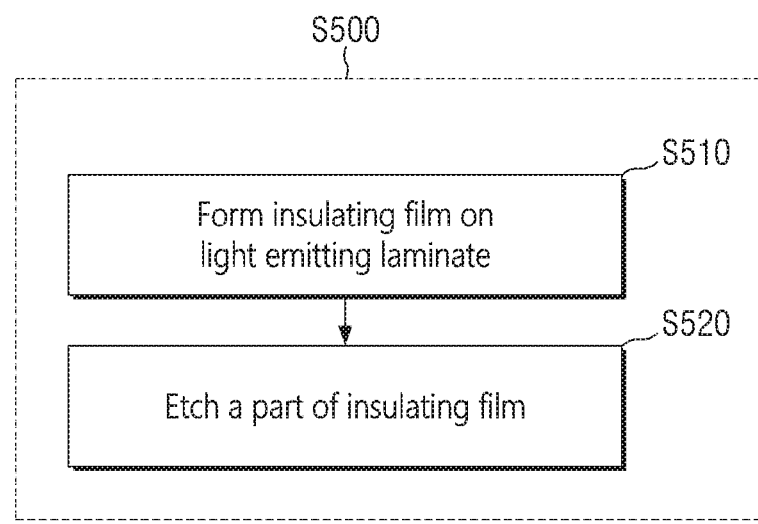
FIG. 9 is a detailed flowchart of an operation of performing a second etching process according to an embodiment.

FIG. 5 is a flowchart illustrating a method of manufacturing a light-emitting element according to an embodiment. FIG. 6 is a detailed flowchart of an operation of forming a separation layer according to an embodiment. FIG. 7 is a detailed flowchart of an operation of forming a light-emitting laminate according to an embodiment. FIG. 8 is a detailed flowchart of an operation of performing a first etching process according to an embodiment. FIG. 9 is a detailed flowchart of an operation of performing a second etching process according to an embodiment.

Referring to FIG. 5, a method of manufacturing a light-emitting element may include: disposing (e.g., positioning, placing, or locating) a substrate 100 (e.g., see FIG. 10) (S100); forming a separation layer 200 (e.g., see FIG. 11) on the substrate 100 (S200); forming a light-emitting laminate 300 (e.g., see FIGS. 12-14) on the separation layer 200 (S300); performing a first etching process (e.g., see FIGS. 15 and 16) (S400); performing a second etching process (e.g., see FIGS. 17 and 18) (S500); separating the light-emitting element 10 from the separation layer 200 through first chemical separation (e.g., see FIG. 19) (S600); separating the separation layer 200 and the substrate 100 through second chemical separation (e.g., see FIG. 20) (S700); and reusing the separated substrate 100 (S800).

Referring to FIG. 6, the forming of the separation layer 200 (S200) may include forming a first sacrificial layer 210 on the substrate (S210); forming an etching control layer 220 on the first sacrificial layer 210 (S220); and forming a second sacrificial layer 230 on the etching control layer 220 (S230).

Referring to FIG. 7, the forming of the light-emitting laminate 300 (S300) may include forming a first semiconductor layer 320 on the separation layer 200 (S320); forming an active layer 330 on the first semiconductor layer 320 (S330); and forming a second semiconductor layer 340 on the active layer 330 (S340). The forming of the light-emitting laminate 300 (S300) may further include forming a first electrode layer 310 on the separation layer 200 (S310); and/or forming a second electrode layer 350 on the second semiconductor layer 340 (S350). The forming of the first electrode layer 310 on the separation layer 200 (S310) may be performed before the forming of the first semiconductor layer 320 on the separation layer 200 (S320).

Referring to FIG. 8, the performing of the first etching process (S400) may include forming a mask layer 400 on the light-emitting laminate 300 (e.g., on the second semiconductor layer 340 or on the second electrode layer 350) (S410); forming a fine pattern PA on the mask layer 400 (S420); and etching the light-emitting laminate 300 along the fine pattern PA (e.g., see FIGS. 15 and 16) (S430).

Referring to FIG. 9, the performing of the second etching process (S500) may include forming an insulating film 500 on the light-emitting laminate 300 (S510); and etching a part of the insulating film 500 (e.g., see FIGS. 17 and 18) (S520).

Hereinafter, a method of manufacturing the light-emitting element will be described in sequence with reference to FIGS. 10 to 20, and a method of reusing the substrate after manufacturing the light-emitting element will be described.

FIGS. 10 to 20 are cross-sectional views sequentially showing a method of manufacturing a light-emitting element according to an embodiment.

Figure 10:
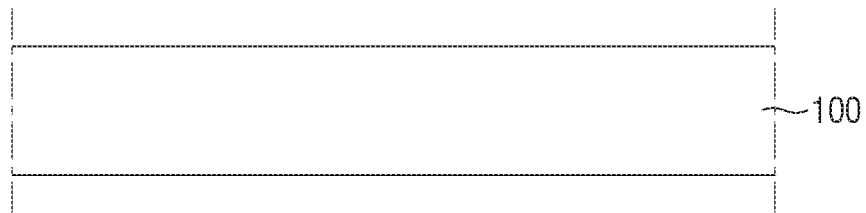
FIGS. 10 to 20 are cross-sectional views sequentially showing a method of manufacturing a light-emitting element according to an embodiment.

In FIG. 10, the disposing of the substrate 100 configured to support the light-emitting laminate 300 (S100) will be described. Referring to FIG. 10, the substrate 100 for supporting the light-emitting laminate 300 for manufacturing the light-emitting element 10 is placed. The substrate 100 may be a GaAs, GaP, or InP substrate, for example. The substrate 100 may be a wafer for epitaxial growth. The substrate 100 may include a sapphire substrate having a GaAs layer on the surface, a SiC substrate having a GaAs layer on the surface, or a ZnO substrate having a GaAs layer on the surface. Further, a Ge substrate having a GaAs layer on the surface or a Si substrate having a GaAs layer on a Si wafer with a buffer layer therebetween may also be applied. As the substrate 100, a commercially available monocrystalline substrate that may be manufactured by a known manufacturing method may be used. A material of the substrate 100 is not limited thereto so long as the material may satisfy a selectivity for manufacturing the light-emitting element 10 and may achieve epitaxial growth smoothly. Hereinafter, it is described that the substrate 100 is a GaAs substrate made of GaAs.

The separation layer 200 and the light-emitting laminate 300 formed on the substrate 100 may be formed through epitaxial growth, and may be formed by an MOCVD method, an MBE method, a VPE method, an LPE method, or the like. The epitaxially grown surface of the substrate 100 may suitably be smooth. The thickness of the substrate 100 is in an appropriate range depending on the size of the substrate 100. If the thickness of the substrate 100 is smaller than an appropriate range, the substrate may be broken during the process of manufacturing the light-emitting element 10, and thus the yield may decrease. On the other hand, if the thickness of the substrate 100 is larger than the appropriate range, an associated material cost increases. As a result, when the substrate 100 has a large size, for example, a diameter of about 75 mm, a thickness of about 250 μm to about 500 μm may prevent cracking during handling. Similarly, when the size of the substrate 100 has a diameter of about 50 mm, a thickness of about 200 μm to about 400 μm may be suitable, and when the diameter of the substrate 100 is about 100 mm, the thickness of the substrate 100 may suitably be about 350 μm to about 600 μm. In the present embodiment, the diameter of the substrate 100 may suitably be about 75 mm or more in terms of productivity. As described above, by increasing the thickness of the substrate 100 according to the size of the substrate 100, it is possible to reduce the warp of the substrate 100 in the laminated structure due to the epitaxial growth. The shape of the substrate 100 is not limited to a circle, but may be a polygonal shape such as a rectangle.

Figure 11:
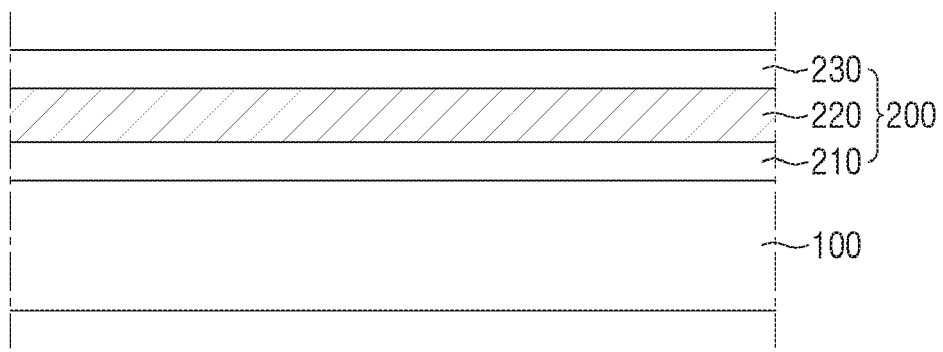

FIG. 11 illustrates the forming of the separation layer 200 on the substrate 100 (S200). The separation layer 200 may be formed on the substrate 100 by an MOCVD method, an MBE method, a VPE method, an LPE method, or the like.

Referring to FIG. 11, the separation layer 200 is located on the substrate 100. The substrate 100 and the separation layer 200 may contact each other. The separation layer 200 may be between the light-emitting element 10 and the substrate 100 during the process of manufacturing the light-emitting element 10. The separation layer 200 may physically separate the light-emitting element 10 from the substrate 100. The separation layer 200 may have a structure including at least one sacrificial layer. The structure of the separation layer 200 may vary, and a lamination structure of the separation layer 200, and a separation method according to the lamination structure, will be described below in detail with reference to FIGS. 21 to 23.

The separation layer 200 may include the first sacrificial layer 210, the etching control layer 220, and the second sacrificial layer 230. The separation layer 200 may be formed by sequentially laminating the first sacrificial layer 210, the etching control layer 220, and the second sacrificial layer 230.

The first sacrificial layer 210 may be interposed between the substrate 100 and the etching control layer 220. The first sacrificial layer 210 may physically separate the substrate 100 and the etching control layer 220 from each other. That is, the separation layer 200 and the substrate 100 may be separated from each other by removing the first sacrificial layer 210.

The etching control layer 220 may be interposed between the first sacrificial layer 210 and the second sacrificial layer 230. The etching control layer 220 may physically separate the first sacrificial layer 210 and the second sacrificial layer 230 from each other. The etching control layer 220 may be a layer on which the etching is not performed any longer during the etching process of the laminated structure located above the etching control layer 220. That is, the etching control layer 220 may be an etching stopper used as a layer for stopping the etching at a suitable position.

The second sacrificial layer 230 may be interposed between the etching control layer 220 and the first semiconductor layer 320. The second sacrificial layer 230 may physically separate the etching control layer 220 and the first semiconductor layer 320 from each other. That is, the light-emitting element 10 may be separated from the separation layer 200 by removing the second sacrificial layer 230.

The first sacrificial layer 210 and the second sacrificial layer 230 may be layers that are removed in the final process.

When the first sacrificial layer 210 and the second sacrificial layer 230 are removed, interlayer separation located at upper/lower portions of the first sacrificial layer 210 and the second sacrificial layer 230 may be performed. The first chemical separation through removal of the second sacrificial layer 230, and the second chemical separation through the removal of the first sacrificial layer 210, will be described below in detail with reference to FIGS. 19 and 20.

The thickness of the etching control layer 220 may be larger than the thickness of the first sacrificial layer 210 and the second sacrificial layer 230. The first sacrificial layer 210 and the second sacrificial layer 230 may be formed with a thickness in a range of about 10 nm to about 50 nm. The etching control layer 220 may be formed with a thickness in a range of about 50 nm to about 150 nm. In one embodiment, the thicknesses of the first sacrificial layer 210 and the second sacrificial layer 230 may be about 30 nm, and the thickness of the etching control layer 220 may be about 100 nm.

Materials of the first sacrificial layer 210, the etching control layer 220, and the second sacrificial layer 230 may be determined according to a selectivity. The material of the first sacrificial layer 210 may be a material having a high selectivity by comparing etch rates of the substrate 100 and the etching control layer 220. In one embodiment, the first sacrificial layer 210 may be formed of AlAs or AlGaAs. Hereinafter, it is described that the first sacrificial layer 210 is formed of AlAs. The etching control layer 220 may be formed of a material that has an etch rate that is faster than the etch rate of the substrate 100, and that is slower than the etch rate of the second sacrificial layer 230. In one embodiment, the etching control layer 220 may be GaInP. Hereinafter, it is described that the etching control layer 220 is formed of GaInP. The material of the second sacrificial layer 230 may be a material having a high selectivity by comparing the etch rates of the substrate 100 and the etching control layer 220. In one embodiment, the second sacrificial layer 230 may be formed of AlAs or AlGaAs. That is, the second sacrificial layer 230 may be formed of the same material as the first sacrificial layer 210. Hereinafter, it is described that the second sacrificial layer 230 is formed of AlAs.

Figure 12:
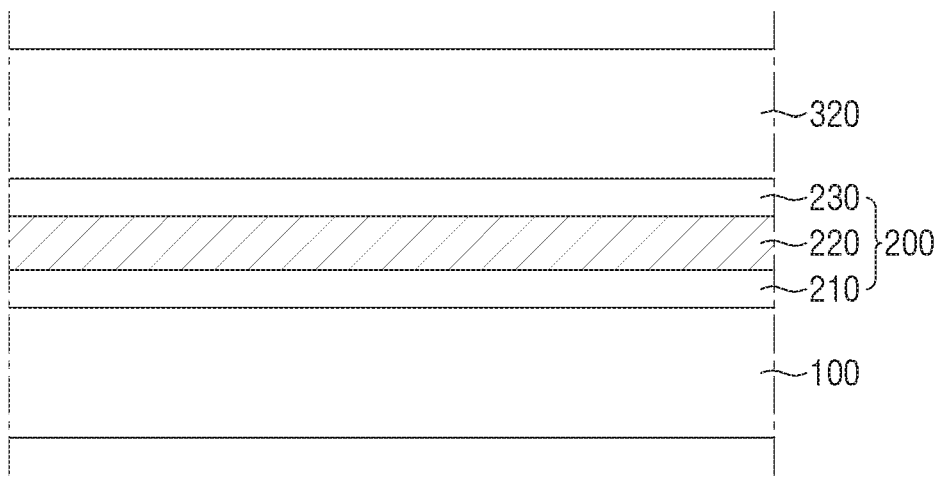
Figure 13:
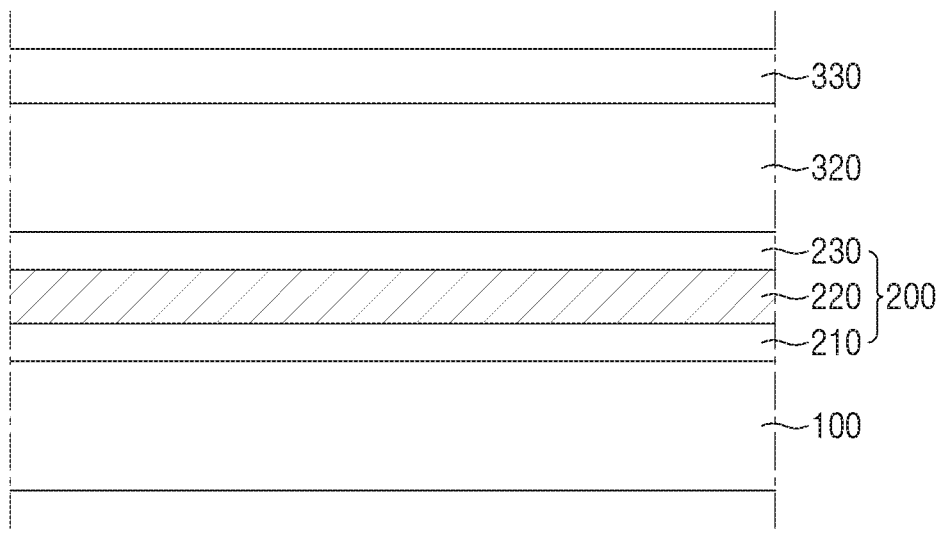
Figure 14:
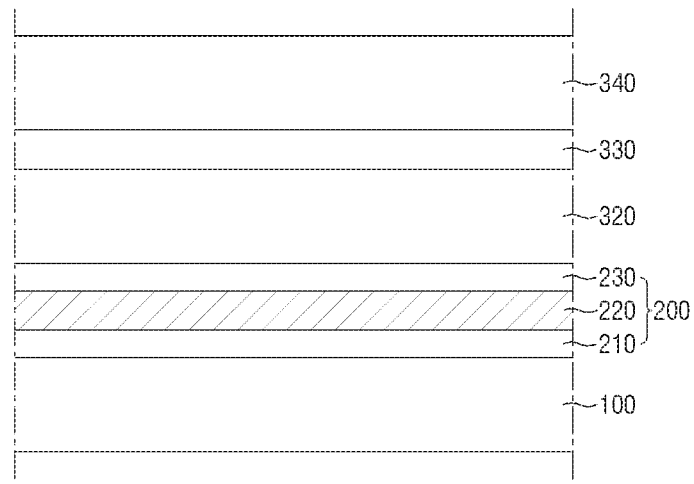

FIGS. 12 to 14 show the forming of the light-emitting laminate 300 on the separation layer 200 (S300). The forming of the light-emitting laminate 300 (S300) may include forming a first semiconductor layer 320 on the separation layer 200 (S320); forming an active layer 330 on the first semiconductor layer 320 (S330); and forming a second semiconductor layer 340 on the active layer 330 (S340). Like the separation layer 200, the light-emitting laminate 300 may be formed through epitaxial growth and may be formed by an MOCVD method, an MBE method, a VPE method, an LPE method, or the like.

FIG. 12 illustrates the forming of the first semiconductor layer 320 on the separation layer 200 (S320). Referring to FIG. 12, the first semiconductor layer 320 may be formed on the separation layer 200. Between the separation layer 200 and the first semiconductor layer 320, an additional semiconductor layer for improving the crystallinity, such as a buffer layer and an undoped semiconductor layer, may be further formed. The first semiconductor layer 320 may include a semiconductor material composed of III (Ga, Al, In)—V (P, As), and may include a semiconductor layer doped with a first conductive dopant, such as Si, Ge, and Sn. For example, the first semiconductor layer 320 may include at least one semiconductor material of GaP, GaAs, GaInP, and AlGaInP doped with Si. That is, the first semiconductor layer 320 may include an n-type semiconductor layer. The material constituting the first semiconductor layer 320 is not limited thereto, and various materials other than the material may constitute the first semiconductor layer 320.

The light-emitting laminate 300 may further include the first electrode layer 310. When the first electrode layer 310 is further included, the forming of the light-emitting laminate 300 (S300) may further include forming the first electrode layer 310 before forming the first semiconductor layer 320 on the separation layer 200 (S310). The first semiconductor layer 320 may be formed on the first electrode layer 310.

FIG. 13 illustrates the forming of the active layer 330 on the first semiconductor layer 320 (S330). The active layer 330 is a region where electrons and holes are recombined. As the electrons and the holes are recombined, the active layer 330 transits to a low energy level and emits light having a wavelength corresponding thereto.

Referring to FIG. 13, the active layer 330 may be formed on the first semiconductor layer 320, and may have a single or multiple quantum well structure. The position of the active layer 330 may be varied according to a type of light-emitting element 10. The active layer 330 may include at least one material of GaInP, AlGaInP, GaAs, AlGaAs, InGaAs, InGaAsP, InP, and InAs. The active layer 330 may emit light having a wavelength of about 500 nm to about 900 nm. The active layer 330 may suitably emit red light or infrared light. The active layer 330 may use a double heterostructure. In other embodiments, a cladding layer doped with a conductive dopant may be further formed on an upper surface 330b and/or a lower surface 330a of the active layer 330 according to the embodiment. In one embodiment, the cladding layer may be implemented as a layer including AlInP.

FIG. 14 illustrates the forming of the second semiconductor layer 340 on the active layer 330 (S340). Referring to FIG. 14, the second semiconductor layer 340 may be formed on the active layer 330, and may include a semiconductor layer of a different type from the first semiconductor layer 320. The second semiconductor layer 340 may include a semiconductor material composed of III (Ga, Al, In)—V (P, As), and may include a semiconductor layer doped with a second conductive dopant such as Mg. For example, the second semiconductor layer 340 may include at least one semiconductor material of GaP, GaAs, GaInP, and AlGaInP doped with Mg. That is, the second semiconductor layer 340 may include a p-type semiconductor layer. A material constituting the second semiconductor layer 340 is not limited thereto, and various materials other than the material may constitute the second semiconductor layer 340.

The light-emitting laminate 300 may further include the second electrode layer 350. When the second electrode layer 350 is further included, the forming of the light-emitting laminate 300 (S300) may further include forming the second electrode layer 350 after forming the second semiconductor layer 340 on the active layer 330 (S350). The second electrode layer 350 may be formed on the second semiconductor layer 340.

Figure 15:
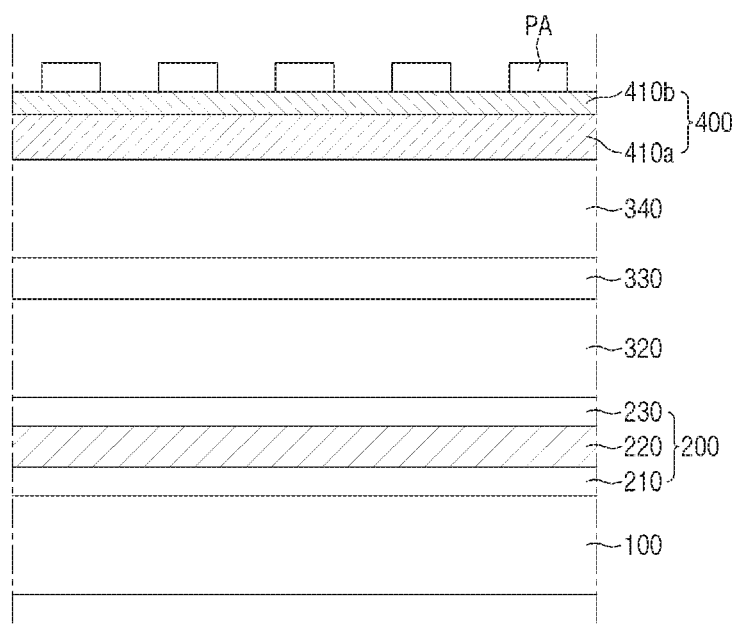
Figure 16:
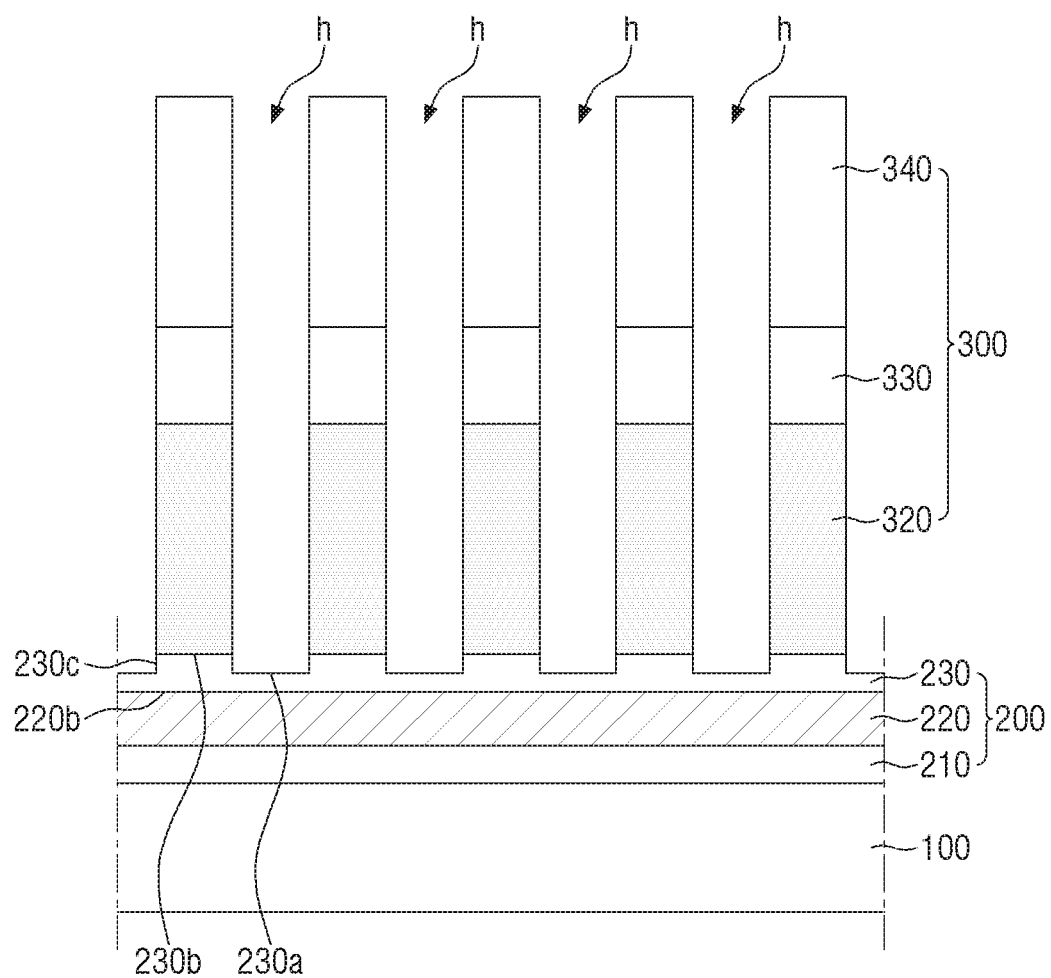

FIGS. 15 and 16 show the performing of the first etching process (S400).

The performing of the first etching process (S400) includes forming a mask layer 400 on the second semiconductor layer 340 (S410); forming a fine pattern PA on the mask layer 400 (S420); and etching the light-emitting laminate 300 along the fine pattern PA (S430).

FIG. 15 illustrates the forming of the mask layer 400 on the second semiconductor layer 340 (S410) and the forming of the fine pattern PA on the mask layer 400 (S420).

Referring to FIG. 15, the mask layer 400 may be formed on the second semiconductor layer 340. The mask layer 400 may include an insulating layer 410a and a metal layer 410b. The insulating layer 410 a may be formed on the second semiconductor layer 340. The insulating layer 410a may serve as a mask for subsequent etching of the light-emitting laminate 300. The insulating layer 410a may use an oxide or a nitride, and may include, for example, a silicon oxide ($SiO_x$), a silicon nitride ($SiN_x$), or the like. The thickness of the insulating layer 410a may be about 0.5 µm to about 1.5 µm. The metal layer 410b may be formed on the insulating layer 410a. The metal layer 410b may serve as a mask for etching. The metal layer 410b may include a metal such as chromium (Cr), but is not limited thereto. The thickness of the metal layer 410b may be about 30 nm to about 150 nm.

The fine pattern PA may be formed on the metal layer 410b. The fine pattern PA may be formed through a polymer layer. The polymer layer may be formed on the metal layer 410b, and a pattern may be formed on the polymer layer at nano or micro intervals to form the fine pattern PA. Specifically, the fine pattern PA may be formed on the polymer layer at nano or micro intervals by a method such as photolithography, E-beam lithography, or nanoimprint lithography. The planar shape of the fine pattern PA may be a circle, but is not limited thereto, and may be a polygon such as a rectangle. In another embodiment, the fine pattern PA may be formed on the metal layer 410b as a nano-sphere or micro-sphere single-layer film. The interval between the fine patterns PA may be about 50 nm to about 3 µm.

FIG. 16 illustrates the etching of the light-emitting laminate 300 along the fine pattern PA (S430). The process includes forming one or more holes h by etching a space between the fine patterns PA formed in FIG. 15. The portion(s) where the fine pattern PA is formed is not etched, and only the space portion(s) spaced between the fine patterns PA is etched to form the hole h. That is, the second sacrificial layer 230 which is not overlapped with the fine pattern PA may be etched, but the second sacrificial layer 230 overlapped with the fine pattern PA is not etched. The hole h may be selectively formed from the mask layer 400 to the upper surface 220b of the etching control layer 220. As an embodiment, the hole h may be formed to include at least a portion of the second sacrificial layer 230. FIG. 16 shows that a part of the second sacrificial layer 230 is removed by etching so that the surface of the second sacrificial layer 230 has an uneven pattern. The uneven pattern of the second sacrificial layer 230 may include an uneven lower surface 230a, an uneven upper surface 230b, and an uneven side surface 230c. The uneven upper surface 230b may be a surface in contact with the light-emitting laminate 300. The uneven lower surface 230a may be a surface that is overlapped with the hole h in a vertical direction. The uneven side surface 230c may be a surface that is vertically connected to the uneven upper surface 230b and the uneven lower surface 230a. In addition, the uneven side surface 230c may be included in an extending surface of the side surface of the light-emitting element 10.

The etching of the light-emitting laminate 300 may be performed by using a dry etching method such as reactive ion etching (RIE), reactive ion beam etching (RIBE), or inductively coupled plasma reactive ion etching (ICP-RIE). Unlike a wet etching method, such a dry etching method is capable of one-way etching, and is suitable for forming such a pattern. That is, in the wet etching method, isotropic etching is performed and etching is performed in all directions. Unlike this, in the wet etching method, etching that is mainly performed in a depth direction for forming the hole h is possible, and the size, interval, and the like of the hole h may be formed by desired patterns. At this time, when the RIE, RIBE or ICP-RIE method is used, $Cl_2$, $O_2$, or the like may be used as etching gas capable of etching the metal layer 410b. The interval of the light-emitting elements 10 manufactured on the substrate 100 may coincide with the interval of the fine patterns PA.

After performing the first etching process (S400), the fine pattern PA, the metal layer 410b, and the insulating layer 410a remaining on the light-emitting laminate 300 may be removed through a general wet etching or dry etching method, although the present embodiment is not limited thereto, and a general removal method may be used.

Figure 17:
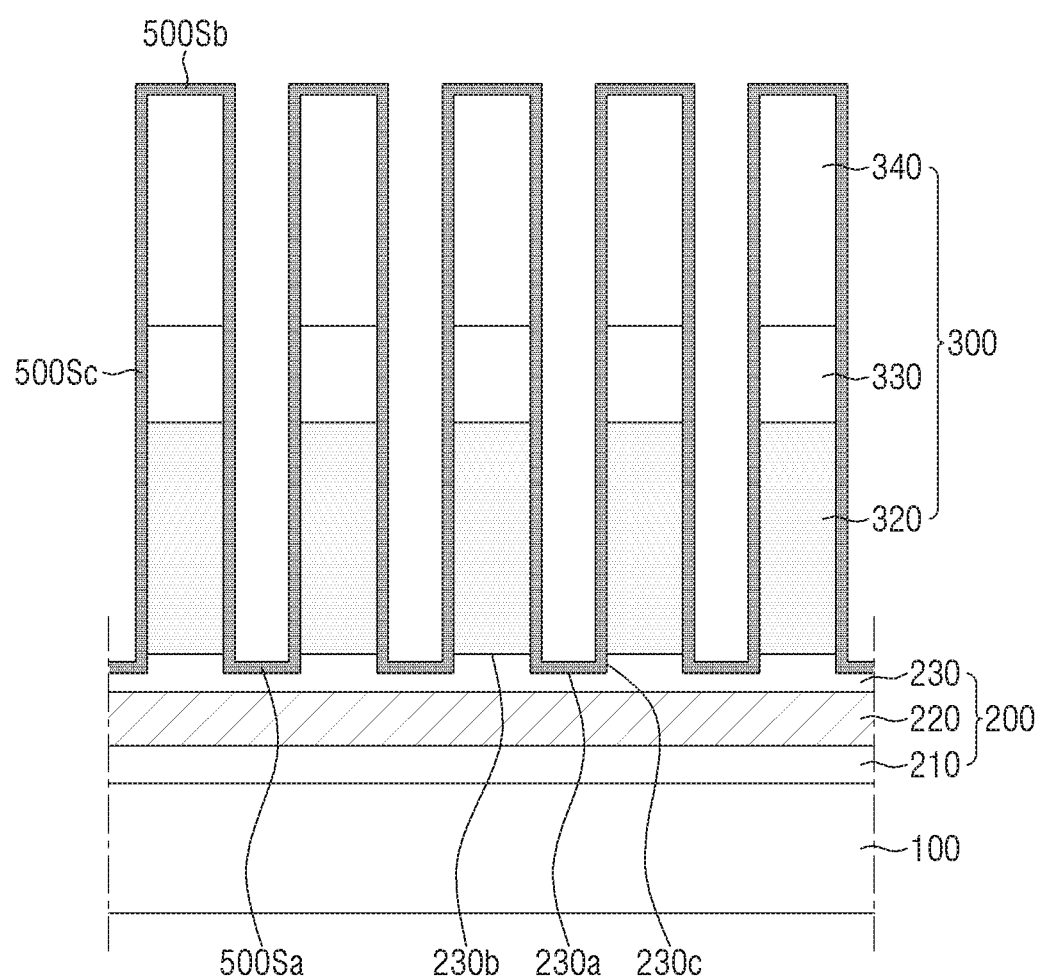
Figure 18:
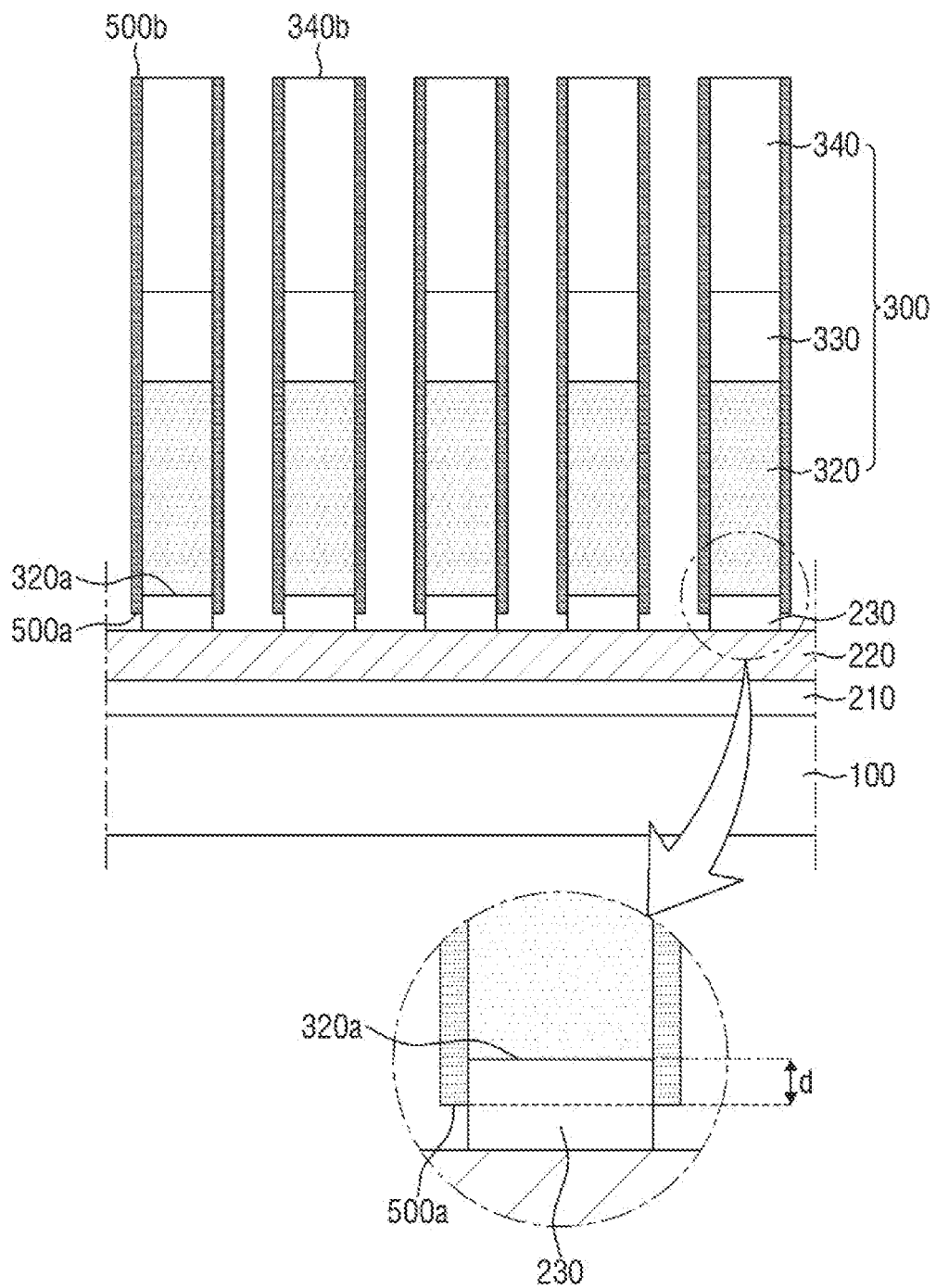

FIGS. 17 and 18 illustrate the performing of the second etching process (S500).

The performing of the second etching process (S500) includes forming the insulating film 500 on the light-emitting laminate 300 (S510); and etching a part of the insulating film 500 (S520).

FIG. 17 illustrates the forming of the insulating film 500 on the light-emitting laminate 300 (S510). Referring to FIG. 17, the insulating film 500 may include an upper insulating film 500Sb, a lateral insulating film 500Sc, and a lower insulating film 500Sa. The upper insulating film 500Sb may completely cover the upper surface of the light-emitting laminate 300. That is, the upper insulating film 500Sb may cover the upper surface 340b of the second semiconductor layer 340. The lateral insulating film 500Sc may completely cover the side surface of the light-emitting laminate 300. The lateral insulating film 500Sc may cover a part of the second sacrificial layer 230 together with the side surface of the light-emitting laminate 300. In the aforementioned first etching process, the second sacrificial layer 230 may have an uneven shape and the lateral insulating film 500Sc may cover at least a part of the irregular side surface 230c of the second sacrificial layer 230. The lower insulating film 500Sa may cover an uneven lower surface 230a of the second sacrificial layer 230. The upper insulating film 500Sb, the lateral insulating film 500Sc, and the lower insulating film 500Sa may be connected to each other on the substrate 100 and may be continuous.

The method of forming the insulating film 500 may use a method of applying an insulating material on the light-emitting laminate 300 attached to the substrate 100, but the present invention is not limited thereto. The material that may be used as the insulating film 500 may include at least one selected from the group consisting of $SiO_2$, $Si_3N_4$, $Al_2O_3$, and $TiO_2$, but is not limited thereto. As an example, a $Al_2O_3$ film may be formed by an atomic layer deposition (ALD) method, and a thin film may be formed using chemical adsorption and desorption by supplying trimethyl aluminum (TMA) and a $H_2O$ source in a pulse form.

FIG. 18 illustrates the etching of a part of the insulating film 500 (S520). Referring to FIG. 18, a part of the insulating film 500 that is formed on the substrate 100 through etching may be removed. FIG. 18 shows a state after the upper insulating film 500Sb and the lower insulating film 500Sa of the insulating film 500 are removed through the second etching process.

After performing the second etching process (S500), in the insulating film 500, only on the lateral insulating film 500Sc covering the side surface of the light-emitting laminate 300 may remain. That is, the upper insulating film 500Sb may be all removed. Although FIG. 18 shows that the upper insulating film 500Sb is removed so that the upper surface 500b of the insulating film 500 and the upper surface 340b of the second semiconductor layer 340 are located on the same plane, a part of the lateral insulating film 500Sc connected to the upper insulating film 500Sb may also be removed together with the upper insulating film 500Sb. As an example, the upper surface 500b of the insulating film 500 may be located closer to the substrate 100 than the upper surface 340b of the second semiconductor layer 340 (e.g., the upper surface 500b may be lower than the upper surface 340b).

The lower insulating film 500Sa may be completely removed. FIG. 18 shows that the lower insulating film 500Sa is removed so that the lateral insulating film 500Sc covers both the first semiconductor layer 320 and a part of the second sacrificial layer 230. That is, the lower surface 500a of the insulating film 500 may be located closer to the substrate 100 than the lower surface 320a of the first semiconductor layer 320. A difference d between a distance from the substrate 100 to the lower surface 320a of the first semiconductor layer 320 and a distance from the substrate 100 to the lower surface 500a of the insulating film 500 may be within about 100 nm. However, the present invention is not limited thereto, and a part of the lateral insulating film 500Sc connected to the lower insulating film 500Sa may be removed concurrently during the second etching process so that the lower surface 320a of the first semiconductor layer 320 and the lower surface 500a of the insulating film 500 may be located on the same plane.

The second sacrificial layer 230 not overlapped with the light-emitting laminate 300 may be all removed. The etching control layer 220 in the region not overlapped with the light-emitting laminate 300 may be exposed.

The light-emitting element 10 may be formed on the substrate 100 by performing the second etching process.

Figure 19:
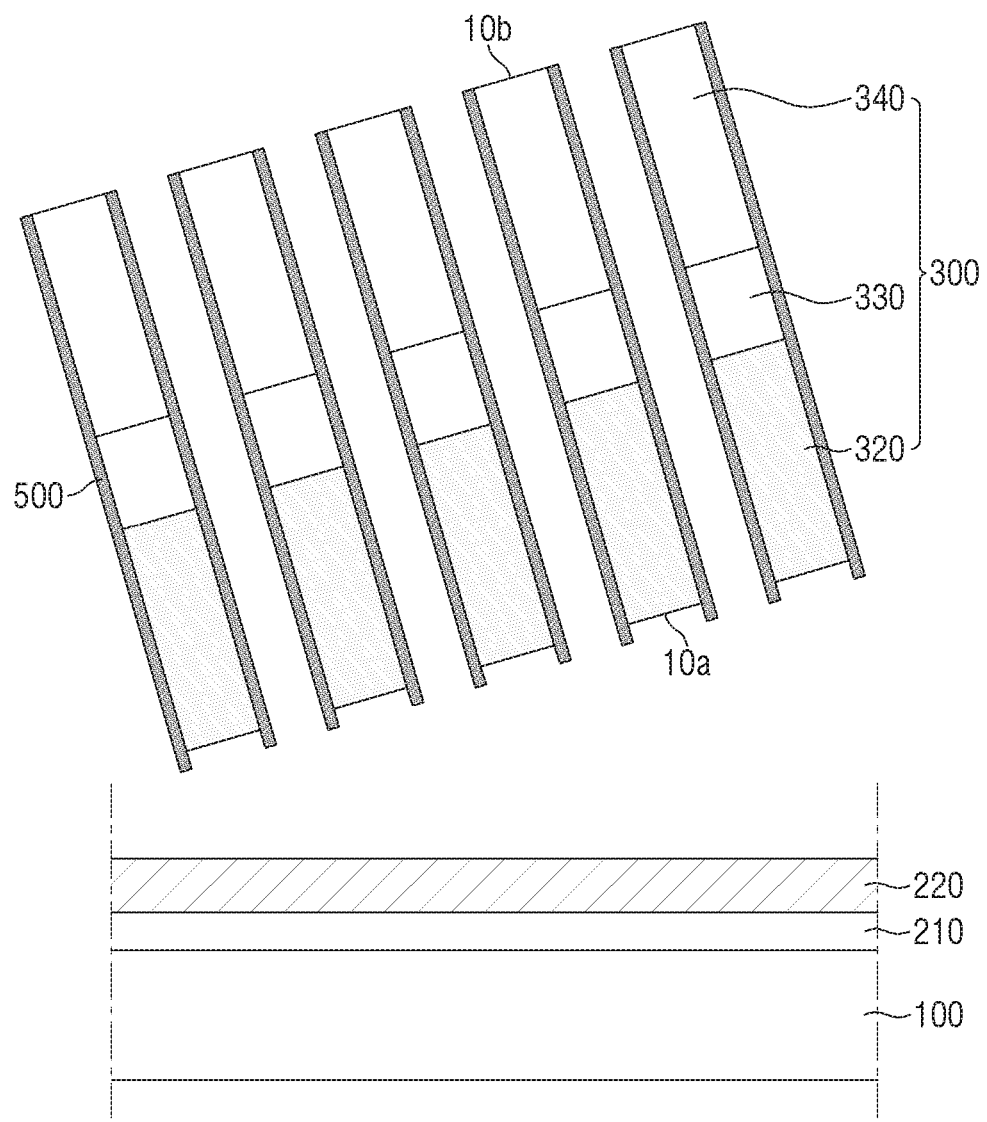

FIG. 19 illustrates the separating of the light-emitting element 10 from the separation layer 200 through the first chemical separation (S600). Referring to FIG. 19, a chemical lift-off (CLO) method may be used to separate the completed light-emitting element 10 from the separation layer 200. The chemical separation may be performed by removing the second sacrificial layer 230. The method of separating the light-emitting element 10 from the separation layer 200 by removing the second sacrificial layer 230 is referred to as first chemical separation.

When the light-emitting element 10 formed on the substrate 100 is separated by a physical method, a separation surface of the manufactured light-emitting element 10 may be not flat, but instead may be rough. Particularly, when a partial inclined region is formed on the separation surface of the light-emitting element 10, for example, when the lower surface 10a of the light-emitting element 10 is not flat, when a contact electrode is connected to the light-emitting element 10, there may be a problem or defect in which a contact electrode material becomes disconnected. As a result, the contact electrode may be disconnected to cause short-circuit defects, and an electrical signal might not be applied to the light-emitting element 10. To avoid or prevent the problem, the light-emitting element 10 may suitably have a smooth shape of the separation surface from the substrate 100.

Accordingly, in the method of manufacturing the light-emitting element according to the present embodiment, when the light-emitting element 10 is separated through the first chemical separation, it is possible to obtain the light-emitting element 10 having a flat lower surface 10a of the light-emitting element 10. Therefore, it is possible to prevent occurrence of the disconnection as described above.

Figure 20:
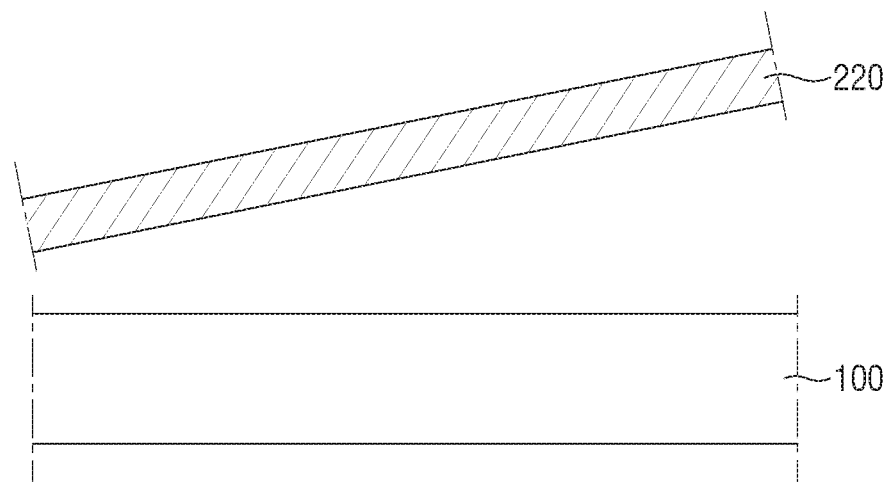

FIG. 20 illustrates separating the separation layer from the substrate through the second chemical separation (S700), and reusing and disposing the separated substrate (e.g., enabling reuse of the substrate 100) (S800). Referring to FIG. 20, a chemical lift-off (CLO) method may be used to separate the separation layer 200 from the substrate 100. The chemical separation may be performed by removing the first sacrificial layer 210. In more detail, the etching control layer 220 and the substrate 100 may be separated from each other by removing the first sacrificial layer 210. The method of separating the separation layer 200 from the substrate 100 by removing the first sacrificial layer 210 is referred to as second chemical separation.

When the light-emitting element 10 formed on the substrate 100 is separated by a physical method, a separation surface of the substrate 100 may be not flat but rough. Further, epitaxial growth might not be properly performed on the substrate 100 having a portion that is partially not flat but rough. That is, the substrate 100 of which the separation surface is not flat may not be used as the substrate 100 for growing other light-emitting elements. Because the substrate 100 may correspond to a large part of the manufacturing cost of the light-emitting element 10, if the substrate 100 is not reused, the processing cost may be largely increased.

The upper surface of the substrate 100 in contact with the lower surface of the first sacrificial layer 210 during chemical lift-off (CLO) performed by removing the first sacrificial layer 210 maintains flatness, and may be separated from the etching control layer 220. That is, the surface of the substrate 100 separated from the etching control layer 220 may be exposed to the outside. In addition, the upper surface of the substrate 100 may have a smooth shape to be parallel to the lower surface of the substrate 100.

The method of manufacturing the light-emitting element according to the present embodiment may include disposing the separated substrate 100 again for reuse (S800). The manufacturing method may be performed on the re-located substrate 100 from the forming of the separation layer on the substrate (S200). As a result, the reuse of the substrate 100 may greatly reduce the processing cost. As such, in the case of reusing the substrate 100 through chemical separation, the method of separating the light-emitting element 10 might not be limited to chemical separation and physical separation.

Figure 21:
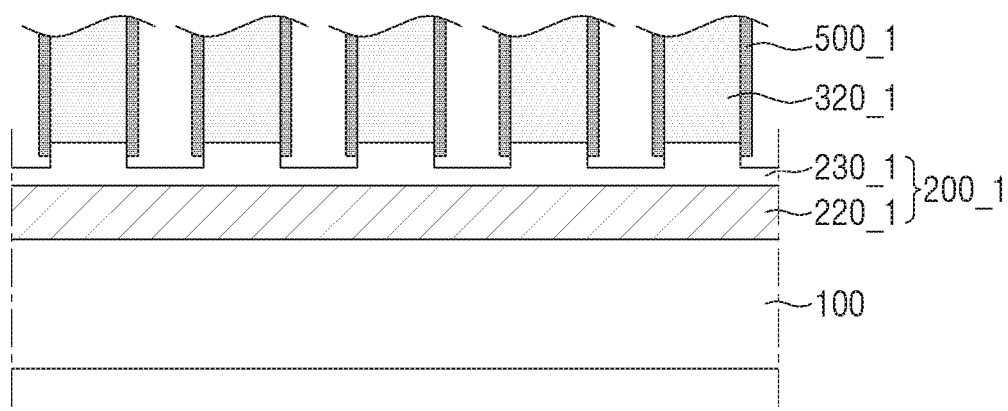
FIGS. 21 to 23 are cross-sectional views of a separation layer according to other embodiments.
Figure 22:
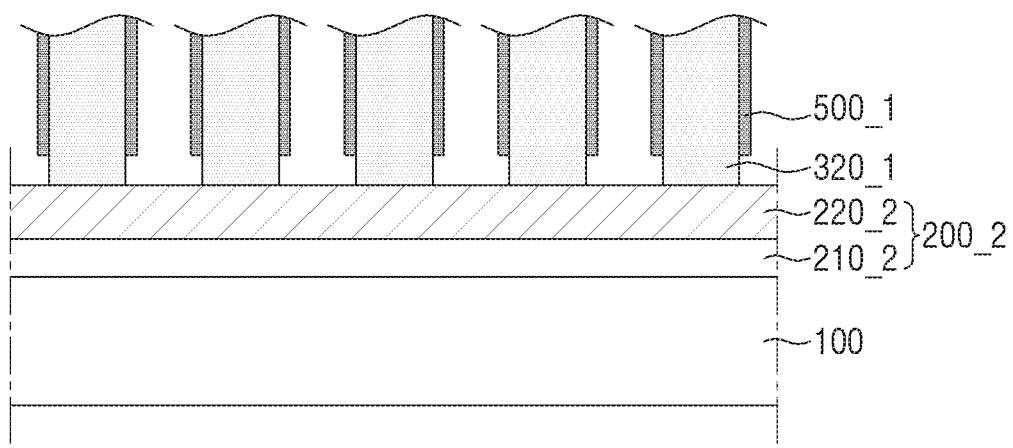
Figure 23:
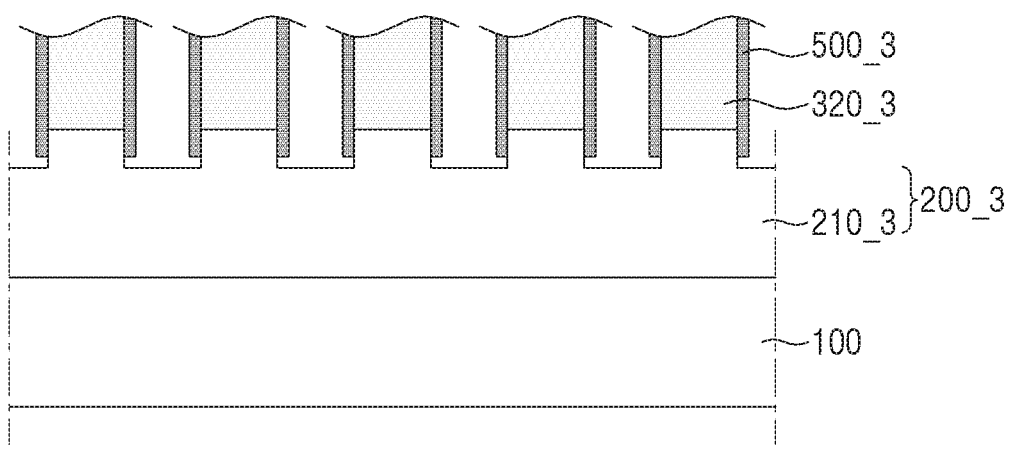

FIGS. 21 to 23 show a laminated structure of a separation layer according to another embodiment.

FIG. 21 shows a state in which a separation layer 200_1 does not include the first sacrificial layer 210 (e.g., does not include operation S210 in FIG. 6), and is formed as an etching control layer 220_1, and a second sacrificial layer 230_1 located on the etching control layer 220_1. A lower surface of a first semiconductor layer 320_1 that is in contact with the second sacrificial layer 230_1 during chemical separation by removing the second sacrificial layer 230_1 may maintain flatness. The etching control layer 220_1 may be removed by using wet etching and the like after a light-emitting element 10_1 is separated.

FIG. 22 shows a state in which a separation layer 200_2 does not include the second sacrificial layer 230 (e.g., does not include operation S230 in FIG. 6), and is formed as an etching control layer 220_2, and a first sacrificial layer 210_2 located below the etching control layer 220_2. In the case of including the first sacrificial layer 210_2 between the substrate 100 and the second sacrificial layer 220_2, after the separation of the light-emitting element 10 is completed, the first sacrificial layer 210_2 is removed to obtain the smooth substrate 100. It is possible to obtain a reusable substrate 100 regardless of the physical/chemical separation of the light-emitting element 10. When the light-emitting element is in contact with the etching control layer 220_2, the lower surface of the insulating film may be farther from the substrate than the lower surface of the light-emitting element. That is, the contact surface of the light-emitting element may be wider than that in another embodiment. If the contact surface is wide, the light-emitting element may be effectively electrically connected to the electrode.

FIG. 23 shows that a separation layer 200_3 does not include the etching control layer 220 (e.g., does not include operation S220 in FIG. 6), but is formed of one sacrificial layer 210_3. The thickness of the sacrificial layer 210_3 may be larger than the thickness of the sacrificial layer of other embodiments. When the sacrificial layer 210_3 is removed, the light-emitting element 10 may be chemically separated from the substrate 100. At this time, the lower surface of the light-emitting element 10 in contact with the sacrifice layer 210_3 may maintain flatness. The light-emitting element 10 is separated by completely removing the sacrificial layer 210_3 on the substrate 100, and then the substrate 100 may be reused for manufacturing the light-emitting element 10. The embodiment of FIG. 23 includes one sacrificial layer 210_3 to obtain a processing gain in that the separation of the light-emitting element 10 and the separation of the substrate 100 may be simultaneously performed.

Figure 24:
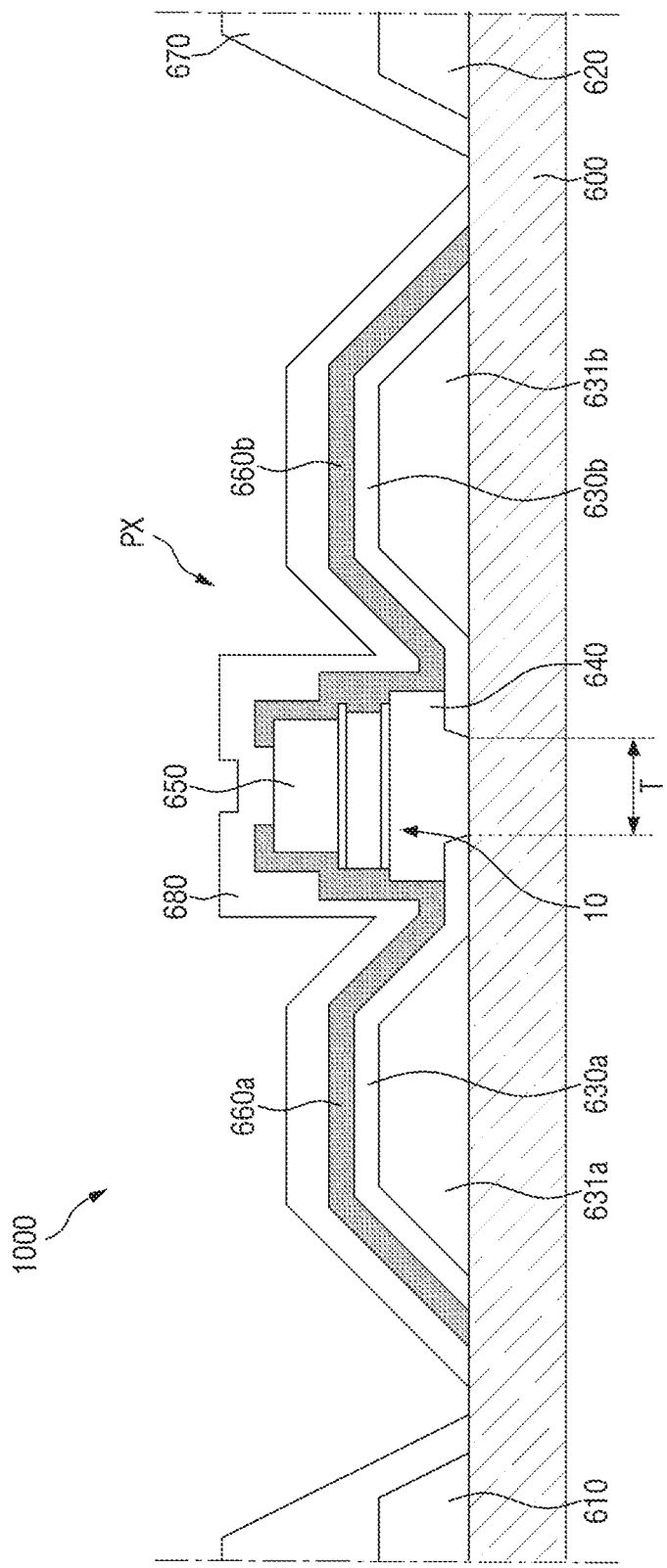
FIG. 24 is a cross-sectional view showing a state in which a light-emitting element according to an embodiment is mounted on a display device.

FIG. 24 is a cross-sectional view showing a state in which a light-emitting element according to an embodiment is mounted on a display device.

A display device 1000 according to an embodiment may include a plurality of pixels PX. Each of the plurality of pixels PX may emit light having a suitable wavelength band, and may be located on a display unit of the display device 1000 to display a series of information to be provided to a user by the display device 1000.

The plurality of pixels PX may include a plurality of light-emitting elements 10 to emit light having different wavelengths. For example, the light-emitting element 10 emits light having a blue, green, or red wavelength band so that the plurality of pixels PX may implement pixels emitting blue, green, or red light, respectively. However, the present invention is not limited thereto. In some cases, the plurality of light-emitting elements 10 all emit light having the same color wavelength band so that the plurality of pixels PX may be implemented to emit light having the same color. In addition, the light-emitting elements 10 emitting the light having different color wavelength bands may be located in one pixel PX to emit light having a different color, for example, white light.

The pixel PX includes a base substrate 600, a plurality of electrodes 630a and 630b located on the base substrate 600, and one or more light-emitting elements 10 connected to contact electrodes 660a and 660b that are located on the electrodes 630a and 630b. A unit pixel PX may further include a barrier structure 670 for partitioning the unit pixel PX from each adjacent pixel PX.

The pixel PX includes the base substrate 600, and a first electrode 630a and a second electrode 630b, which are spaced apart from each other on the base substrate 600 so as to face each other, and also includes the light-emitting element 10, which may be located between the first electrode 630a and the second electrode 630b. A case where the first electrode 630a and the second electrode 630b are directly located on the base substrate 600 is exemplified, but the present invention is not limited thereto, and another layer may be located between the base substrate 600 and the first electrode 630a and the second electrode 630b in other embodiments. For example, a buffer layer, a thin film transistor layer, and the like may be located on the base substrate 600, and the first electrode 630a and the second electrode 630b may be located thereon.

The base substrate 600 may support the plurality of pixels PX. In addition, the plurality of electrodes 630a and 630b, the light-emitting element 10, and the barrier structure 670, which are included in the pixel PX, may also be supported together. The base substrate 600 may be any one of a glass substrate, a quartz substrate, a sapphire substrate, a plastic substrate, and a flexible polymer film, but is not limited thereto.

The first electrode 630a and the second electrode 630b may be spaced apart from each other on the base substrate 600 so as to face each other. The first electrode 630a and the second electrode 630b may receive an electric signal applied from electrode lines 610 and 620. The applied electric signal is transmitted to the light-emitting element 10 located between the first electrode 630a and the second electrode 630b so that the light-emitting element 10 may emit light.

The first electrode 630a and the second electrode 630b may be spaced apart from each other by a suitable distance T, which may be smaller than the length of the light-emitting element 10. When the length of the light-emitting element 10 is smaller than the spaced distance T between the first electrode 630a and the second electrode 630b, electrical contact with the electrode may not be achieved, and thus, the electric signal applied from the electrode lines 610 and 620 may not be received.

The first electrode 630a and the second electrode 630b are respectively formed on reflective barriers 631a and 631b, and may be respectively electrically connected to the first electrode line 610 or the second electrode line 620. The first electrode 630a and the second electrode 630b may transmit an electric signal applied from the electrode lines 610 and 620 to the contact electrodes 660a and 660b.

The reflective barriers 631a and 631b may reflect light emitted from the light-emitting element 10 to transmit the light toward the outside of the display device 1000. The light emitted from the light-emitting element 10 is emitted in all directions without any direction, and the light directed toward the reflective barriers 631a and 631b is reflected to be transmitted to the outside of the display device 1000, for example, the upper portions of the reflective barriers 631a and 631b. Accordingly, the light emitted from the light-emitting element 10 is concentrated in one direction to increase light efficiency.

The first electrode 630a and the second electrode 630b may include conductive materials to be formed of a single layer, and may include a transparent conductive material and a material having a high reflectance to be formed of multiple layers. When the material having the high reflectance is included, the reflectance of the light emitted from the light-emitting element 10 may be maximized. For example, the first electrode 630a and the second electrode 630b may include a conductive material such as aluminum (Al), ITO, IZO, IGO, or the like and silver (Ag) having a high reflectance. However, the present invention is not limited thereto.

Meanwhile, the first electrode 630a, the second electrode 630b, the light-emitting element 10, the first contact electrode 660a, and the second contact electrode 660b may be respectively covered by a plurality of insulating material layers 640, 650, and 680. As shown in FIG. 24, a first insulating material layer 640 may be located between the first electrode 630a and the second electrode 630b, and the light-emitting element 10 may be aligned thereon. The first insulating material layer 640 may include a material such as silicon oxide ($SiO_x$), silicon nitride ($SiN_x$), silicon oxynitride ($SiO_xN_y$), aluminum oxide ($Al_2O_3$), and aluminum nitride (AlN), but is not limited thereto. The first insulating material layer 640 protects the first electrode 630a and the second electrode 630b while preventing the semiconductor layer of the light-emitting element 10 from directly contacting another substrate, thereby reducing or preventing damage to the light-emitting element 10.

The first contact electrode 660a and the second contact electrode 660b may be respectively located on the upper surfaces of the first electrode 630a and the second electrode 630b to transmit an electric signal applied from the first electrode line 610 and the second electrode line 620. The first contact electrode 660a and the second contact electrode 660b may be connected to a first semiconductor layer and a second semiconductor layer of the light-emitting element 10, respectively. Accordingly, the first contact electrode 660a and the second contact electrode 660b transmit the electric signal applied to the first electrode 630a and the second electrode 630b through the electrode lines 610 and 620 to the light-emitting element 10 to emit the light.

The first contact electrode 660a and the second contact electrode 660b may include conductive materials. For example, ITO, IZO, IGO, aluminum (Al), or the like may be included. However, the present invention is not limited thereto.

In addition, the first contact electrode 660a and the second contact electrode 660b are spaced apart from each other on the light-emitting element 10 so as to protect and electrically insulate the first contact electrode 660a and the second contact electrode 660b, and a second insulating material layer 650 may be located in a spaced region. The second insulating material layer 650 may be the same as the first insulating material layer 640 except that the second insulating material layer 650 is formed on the light-emitting element 10. A detailed description thereof will be omitted.

A third insulating material layer 680 may be formed on the first contact electrode 660a, the second contact electrode 660b, and the second insulating material layer 650 to serve as a protective layer against the external environment. When the contact electrodes 660a and 660b are exposed, it is possible to cover the contact electrodes 660a and 660b by the third insulating material layer 680 to avoid a disconnection problem of the contact electrode material that may otherwise be caused by the electrode damage. The third insulating material layer 680 may be located to cover the first electrode 630a, the second electrode 630b, the light-emitting element 10, and the like. The third insulating material layer 680 may be the same as the first insulating material layer 640 with the exception of respective locations.

At least one barrier structure 670 may be located on the base substrate 600 to partition the plurality of pixels PX. The plurality of barrier structures 670 are spaced apart from each other, and as shown in FIG. 24, the first electrode 630a, the second electrode 630b, the light-emitting element 10, and the like are located between the barrier structures 670 spaced apart from each other. In addition, the barrier structures 670 may also be formed to cover the first electrode line 610 and the second electrode line 620.

The plurality of pixels are partitioned by the barrier structures 670 based on the light-emitting element 10 emitting light having a suitable wavelength band. When the light-emitting element 10 is aligned, the barrier structures 670 may prevent the light-emitting element 10 from moving to other adjacent pixels PX. For example, the barrier structure 670 may be polyimide (PI), but the material is not limited thereto and is not particularly limited as long as the surface is hydrophobic.

Further, the barrier structure 670 may also prevent color mixture of light emitted from the light-emitting element 10. In the case of including the light-emitting element 10 that emits light having different wavelength bands between adjacent pixels PX, the light emitted from each pixel PX may also be mixed. In order to reduce the extent of, or to prevent, the problem, the barrier structure 670 is located between the pixels PX to reduce or prevent the light emitted from one pixel PX from being incident on the other pixel PX, thereby preventing color mixing, and thereby improving color purity of the display device.

According to the light-emitting element, the method for manufacturing the same, and the display device according to the embodiment, it is possible to secure flatness of a separation surface of the light-emitting element by chemically separating the light-emitting element grown on the substrate from the substrate without physically separating and reuse the substrate growing the light-emitting element even if chemically or physically separating the light-emitting element.

The effects of the embodiments are not limited by the contents exemplified above, and other various effects are included in the present specification.

In the above description, embodiments of the present invention have been described based on the exemplary embodiments, but the exemplary embodiments are for illustrative, and do not limit the present invention, and those skilled in the art will appreciate that various modifications and applications, which are not exemplified in the above description, may be made without departing from the scope of the essential characteristic of the present exemplary embodiments. For example, each component described in detail in the exemplary embodiment can be modified and executed. Therefore, it should be construed that contents associated with the combination and modification are included in the scope of the present invention.

What is claimed is:

1. A method of manufacturing a light-emitting element comprising:
    positioning a substrate;
    forming a first separation layer, which comprises a first sacrificial layer, an etching control layer on the first sacrificial layer, and a second sacrificial layer on the etching control layer, on the substrate;
    forming at least one first light-emitting element on the first separation layer; and
    separating the first light-emitting element from the substrate,
    wherein the forming at least one first light-emitting element comprises forming a first light-emitting laminate on the first separating layer;
    performing a first etching process after forming a first light-emitting laminate; and
    performing a second etching process after the first etching process, the second etching process comprising forming an insulating film on the vertically etched first light-emitting laminate and vertically etching a part of the insulating film.

2. The method of claim 1, wherein the first light-emitting laminate comprises a first semiconductor layer, an active layer on the first semiconductor layer, and a second semiconductor layer on the active layer.

3. The method of claim 2, wherein the first etching process comprises forming a mask layer on the first light-emitting laminate, forming a fine pattern on the mask layer, and vertically etching the first light-emitting laminate along the fine pattern.

4. The method of claim 2, wherein the active layer is configured to emit light having a wavelength of about 500 nm to about 900 nm.

5. The method of claim 4, wherein the active layer comprises at least one of GaInP, AlGaInP, GaAs, AlGaAs, InP, and InAs.

6. The method of claim 1 wherein the etching control layer is thicker than the first sacrificial layer and the second sacrificial layer.

7. The method of claim 6, wherein the etching control layer is formed with a thickness of about 50 nm to about 150 nm, and wherein the first sacrificial layer and the second sacrificial layer are formed with a thickness of about 10 nm to about 50 nm.

8. The method of claim 7, wherein the etching control layer comprises GaInP, and wherein the first sacrificial layer and the second sacrificial layer comprise AlAs or AlGaAs.

9. The method of claim 1, wherein the separating of the first light-emitting element from the substrate-comprises a first chemical separation process of separating the first light-emitting element by-removing the second sacrificial layer, and
    a second chemical separation process of separating the etching control layer by removing the first sacrificial layer.

10. The method of claim 9, wherein, after the first chemical separation process, a lower surface of the first light-emitting element is substantially flat to be parallel to an upper surface of the first light-emitting element.

11. The method of claim 10, wherein, after the second chemical separation process, an upper surface of the substrate is substantially smooth to be parallel to a lower surface of the substrate.

12. The method of claim 11, wherein the first chemical separation process is performed before the second chemical separation process.

13. The method of claim 1, further comprising forming a second light-emitting element on the substrate after separating the first light-emitting element from the substrate.

14. The method of claim 13, further comprising forming a second separation layer on the substrate between the separating of the first light-emitting element from the substrate and the forming of the second light-emitting element on the substrate.

* * * * *